United States Patent
Crawford et al.

(10) Patent No.: US 8,115,492 B2
(45) Date of Patent: Feb. 14, 2012

(54) FUEL GAUGING SYSTEM AND METHOD THEREOF

(75) Inventors: John D Crawford, Avon, OH (US);
Peter F Hoffman, Avon, OH (US);
David A Spartano, Brunswick, OH (US); Frank F Huang, Lakewood, OH (US); Adam R Jakubiak, Westlake, OH (US); Stephen Osmialowski, Elyria, OH (US)

(73) Assignee: Eveready Battery Company, Inc., St. Louis, MO (US)

( * ) Notice: Subject to any disclaimer, the term of this patent is extended or adjusted under 35 U.S.C. 154(b) by 594 days.

(21) Appl. No.: 12/323,519

(22) Filed: Nov. 26, 2008

(65) Prior Publication Data

US 2009/0189614 A1 Jul. 30, 2009

Related U.S. Application Data

(63) Continuation-in-part of application No. 12/177,969, filed on Jul. 23, 2008.

(51) Int. Cl.
*G01N 27/416* (2006.01)
*G01R 31/36* (2006.01)

(52) U.S. Cl. .................................. 324/430; 702/63
(58) Field of Classification Search .............. 320/430; 702/63; 324/430
See application file for complete search history.

(56) References Cited

U.S. PATENT DOCUMENTS

| 5,406,266 | A | | 4/1995 | Mino et al. |
| 5,661,393 | A | * | 8/1997 | Sengupta ...................... 320/146 |
| 5,767,659 | A | | 6/1998 | Farley |
| 6,020,743 | A | | 2/2000 | Reeves et al. |
| 6,078,871 | A | * | 6/2000 | Anderson ........................ 702/63 |
| 6,191,557 | B1 | | 2/2001 | Gray et al. |
| 6,236,186 | B1 | * | 5/2001 | Helton et al. ................. 320/106 |
| 6,388,447 | B1 | | 5/2002 | Hall et al. |
| 6,403,252 | B1 | | 6/2002 | Chiang et al. |
| 2003/0069704 | A1 | | 4/2003 | Bean |
| 2003/0146733 | A1 | * | 8/2003 | Miller et al. .................. 320/106 |
| 2004/0220758 | A1 | | 11/2004 | Barsoukov et al. |

OTHER PUBLICATIONS

Patent Cooperation Treaty (PCT), International Search Report and Written Opinion for Application No. PCT/US2009/000282, filed Jan. 20, 2009, mailed Jun. 29, 2009, Korean Intellectual Property Office, Korea.

Patent Cooperation Treaty (PCT), International Search Report and Written Opinion for Application No. PCT/US2008/004588, filed Apr. 9, 2008, mailed Oct. 24, 2008, European Patent Office, Netherlands.

* cited by examiner

*Primary Examiner* — M'Baye Diao
(74) *Attorney, Agent, or Firm* — Michael C. Pophal

(57) ABSTRACT

A lighting system is provided that includes at least one lighting device, at least one connector, and a plurality of external power sources. The at least one lighting device includes at least one lighting source, and an internal power source applying a first electrical current to illuminate the at least one lighting element, wherein the internal power source supplies the first electrical current. The at least one connector electrically connects to the at least one lighting device. The plurality of external power sources include at least first and second external power sources that are adapted to be electrically connected to the at least one lighting device by the at least one connector. Further, a fuel gauging system and method detects an electrochemical composition of a power source, which can be at least one of the internal power source and the external power source, and then determines a state of charge of the power source based upon the determined electrochemical composition of the power source.

7 Claims, 36 Drawing Sheets

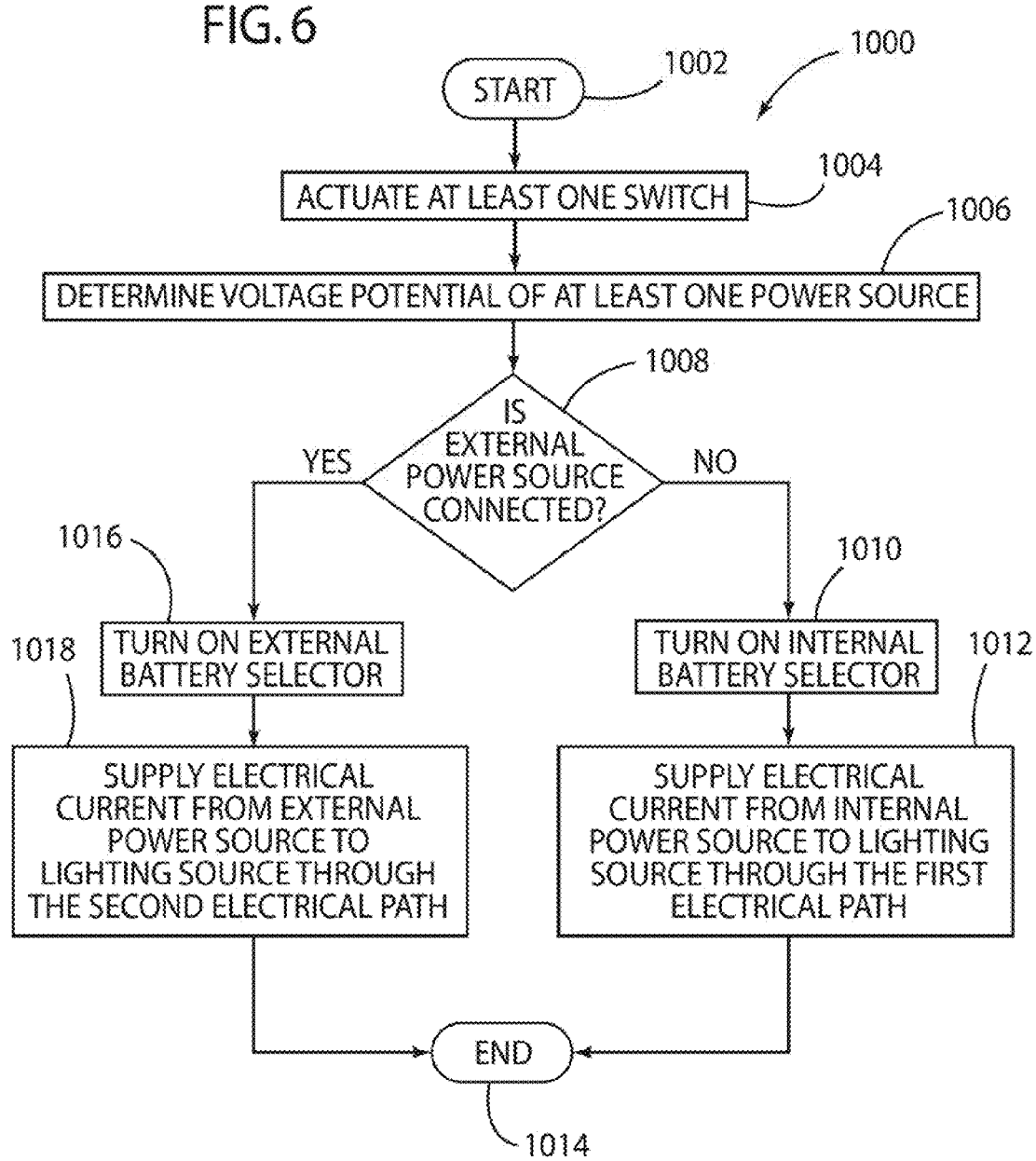

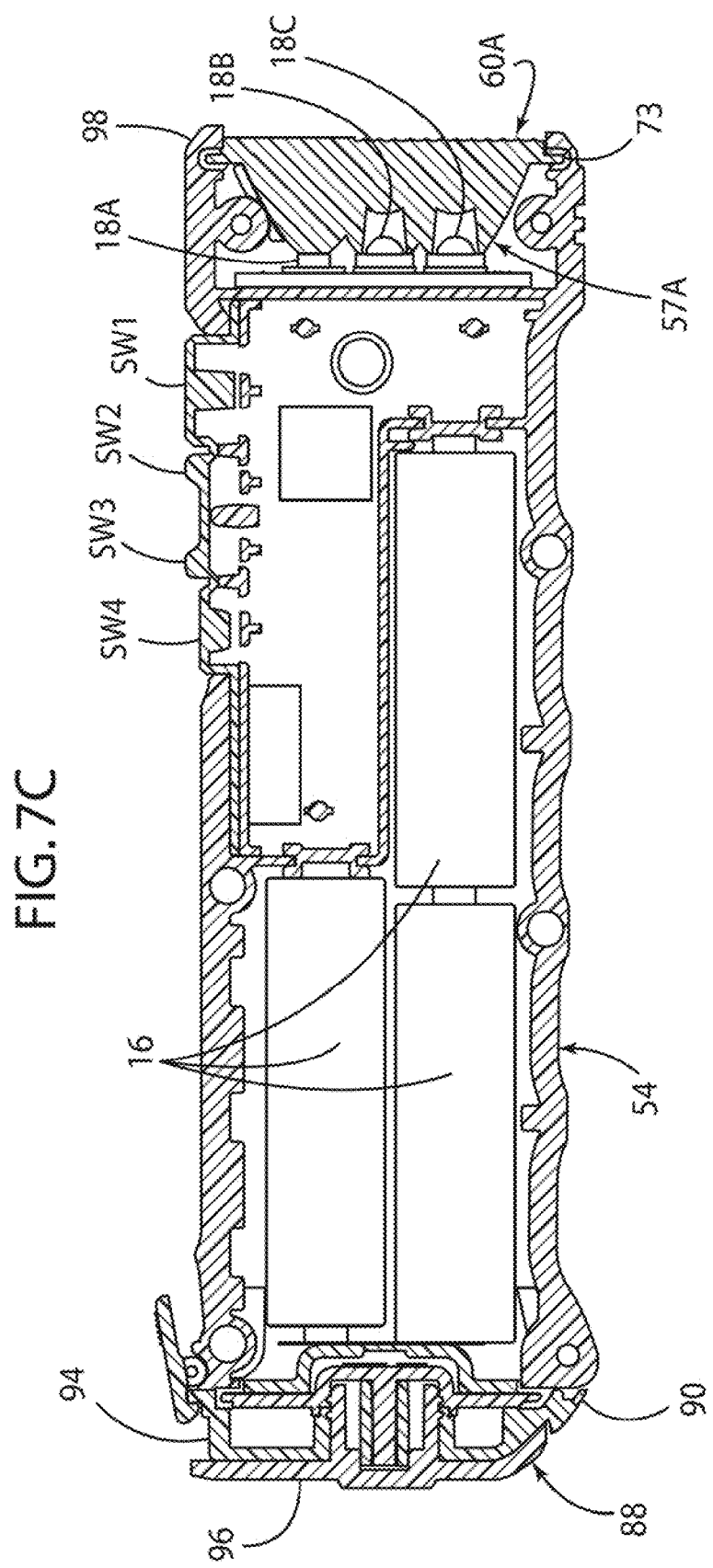

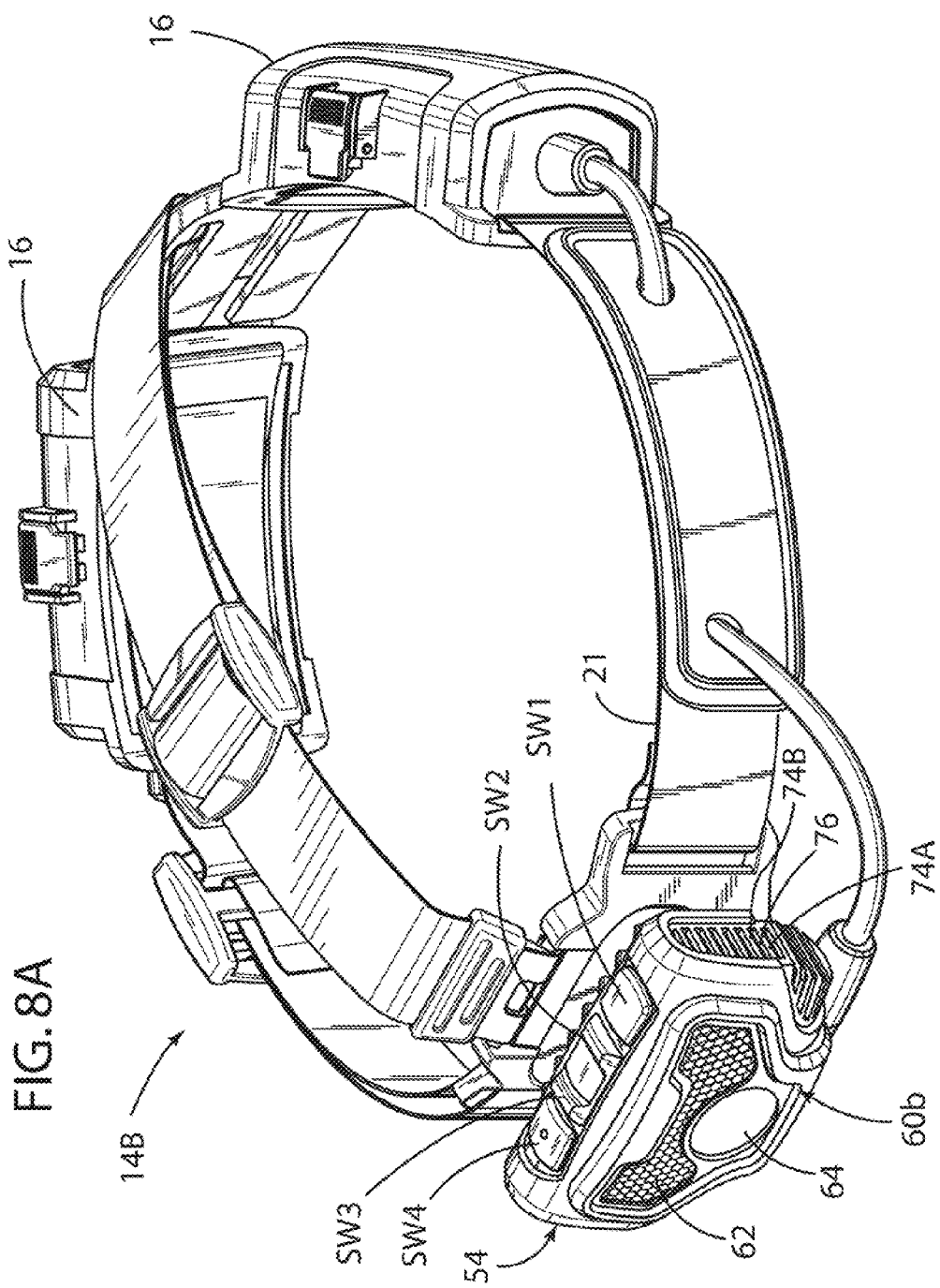

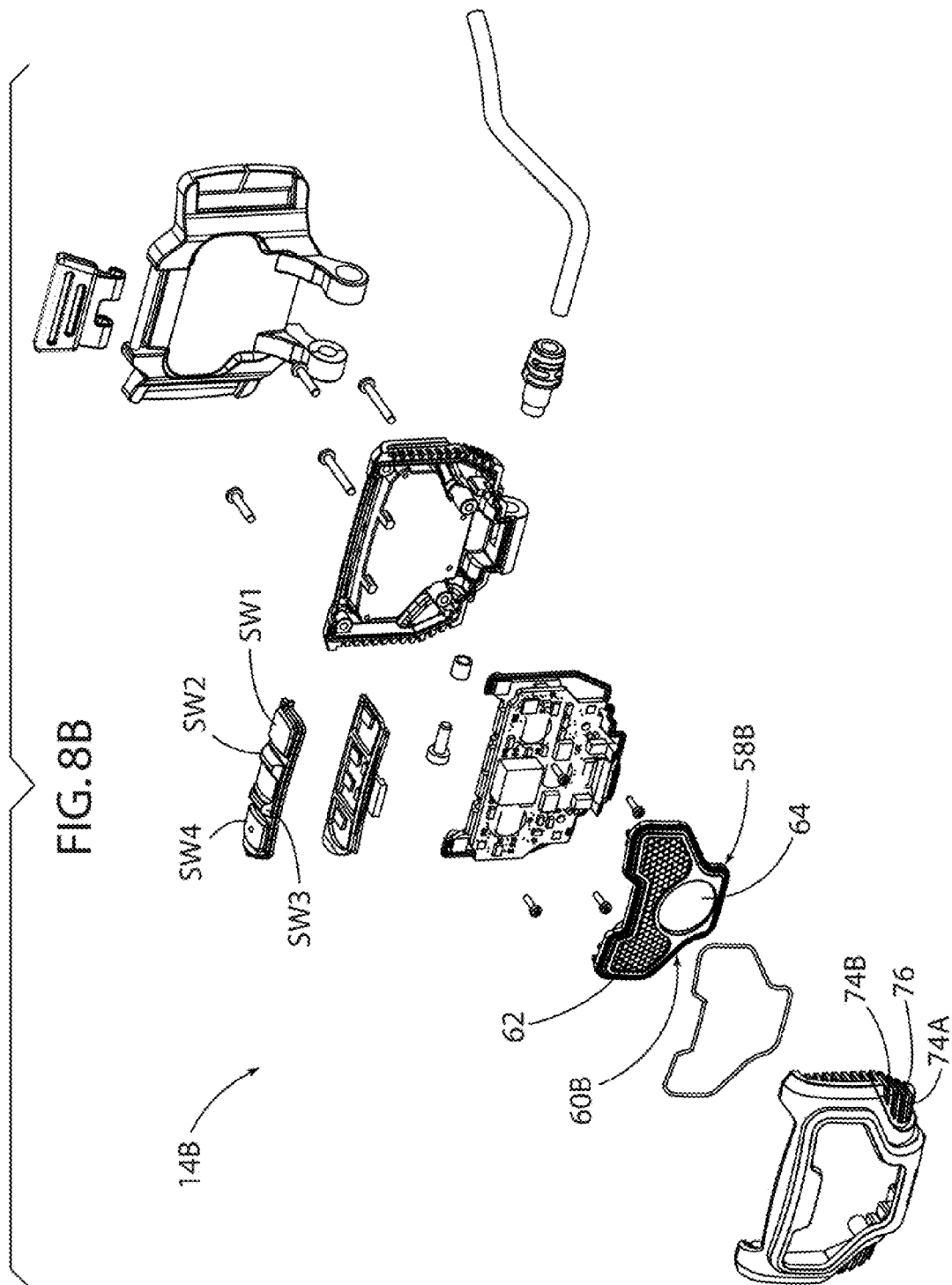

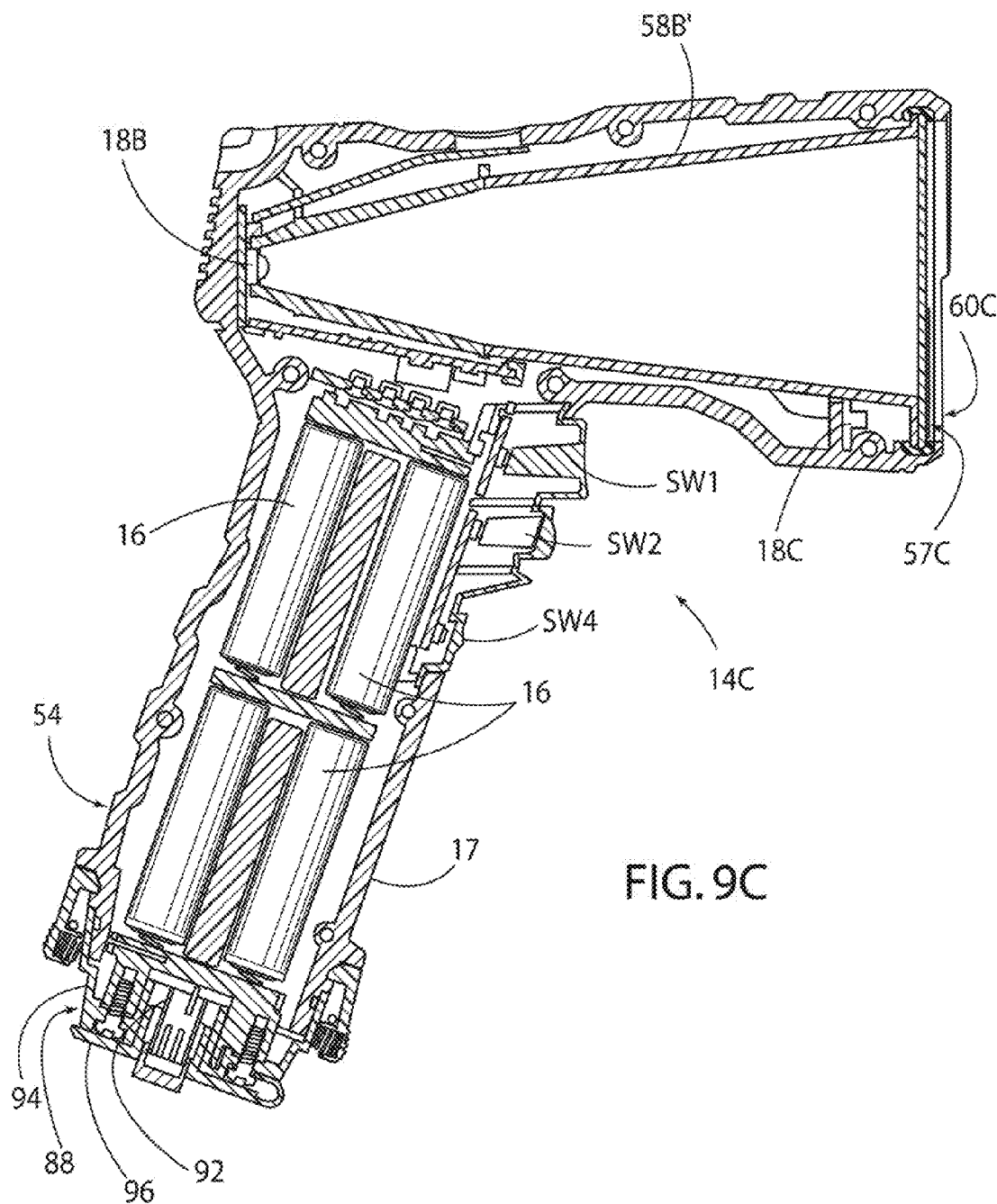

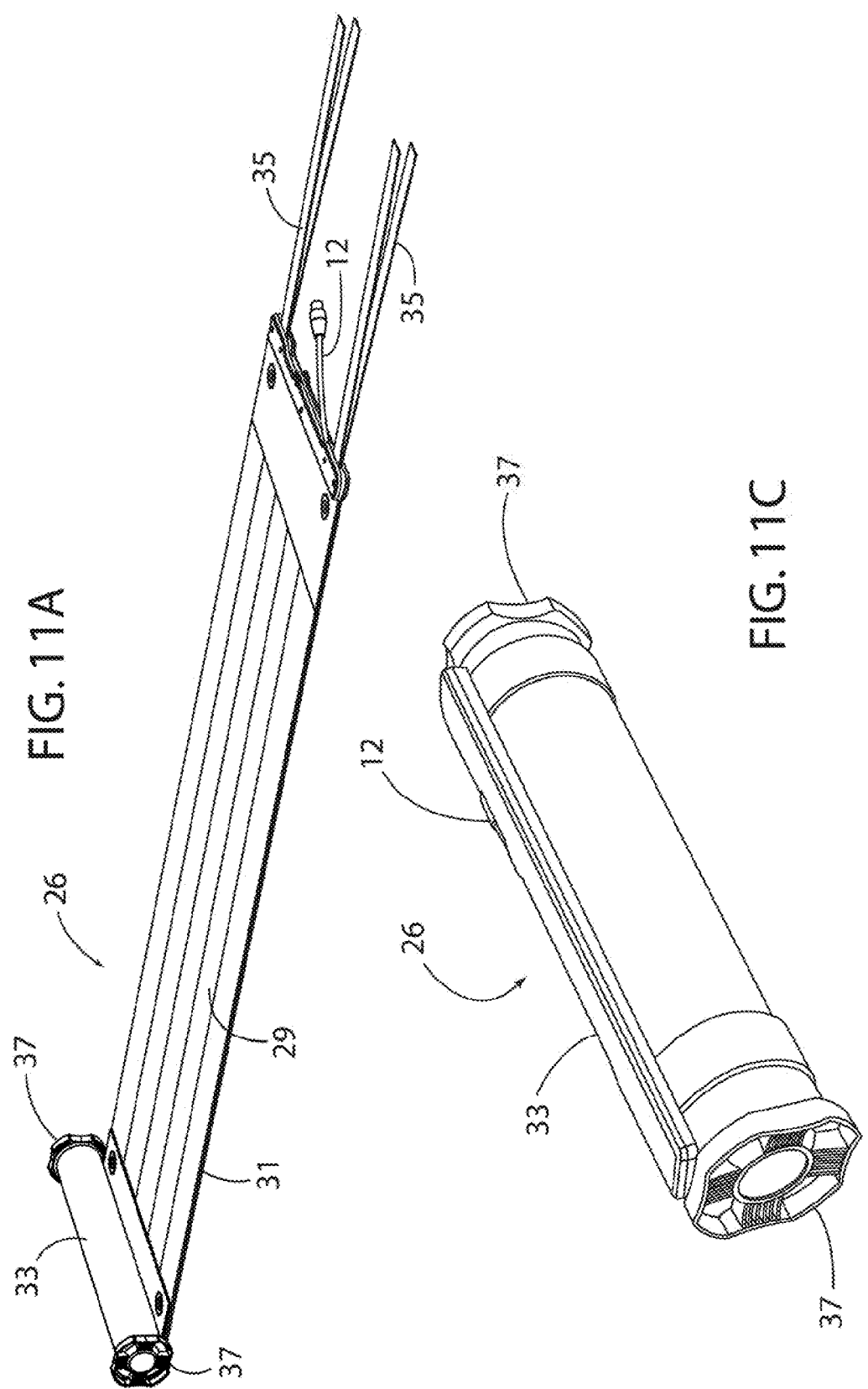

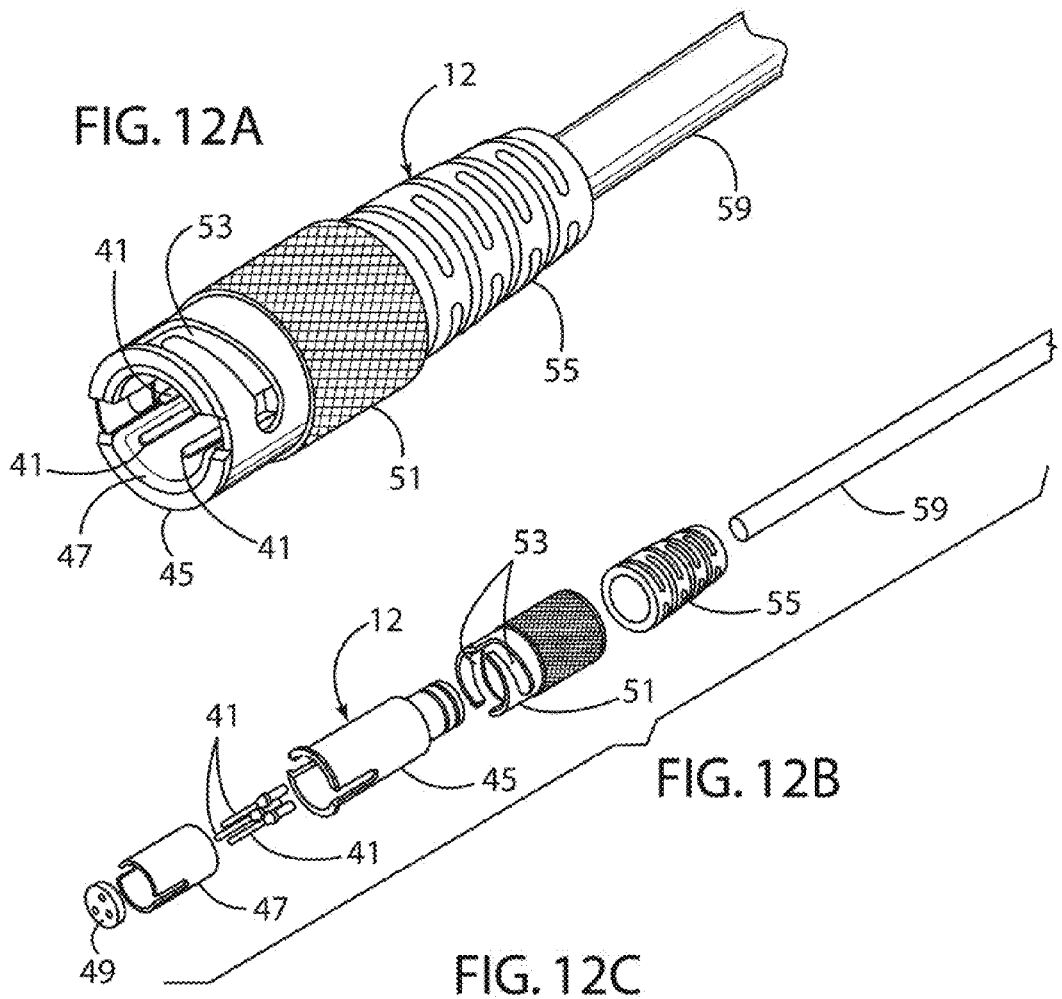
FIG. 12A
FIG. 12B
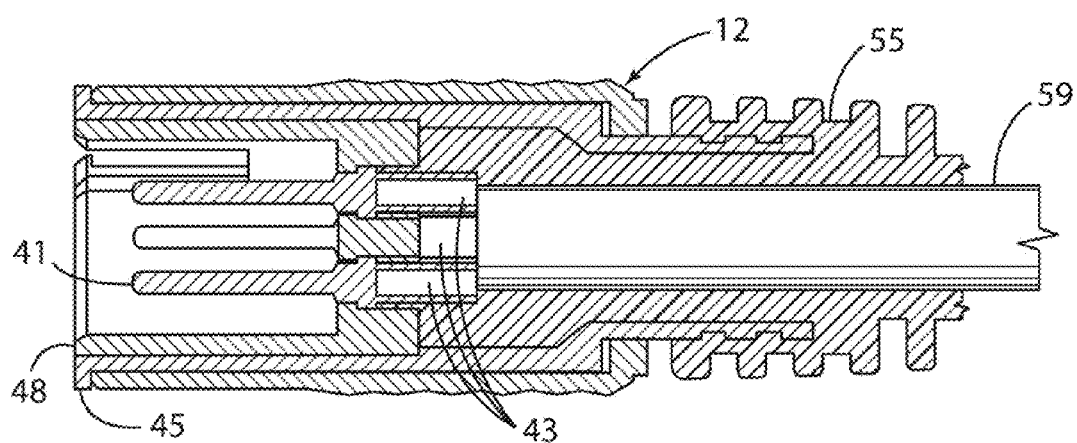
FIG. 12C

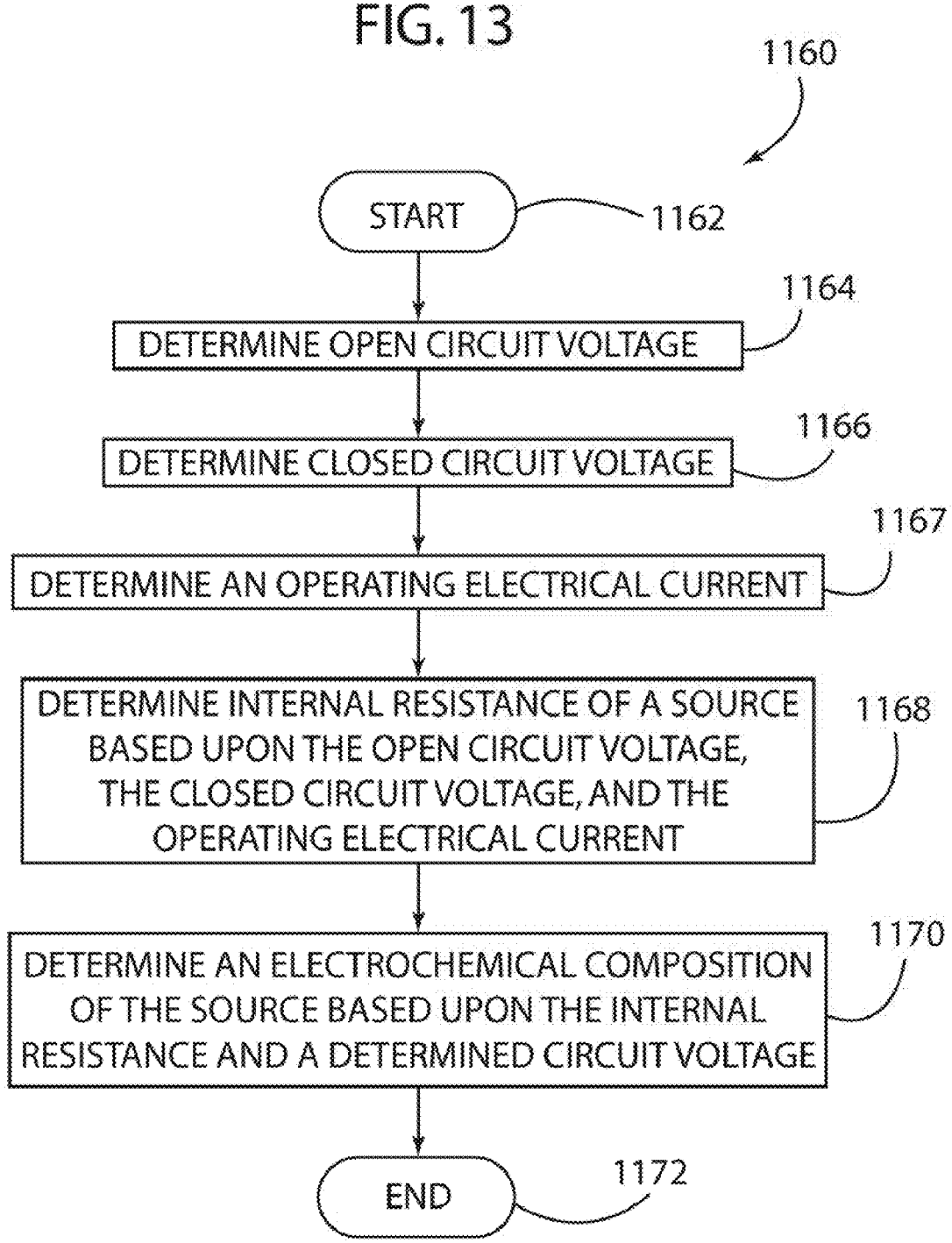

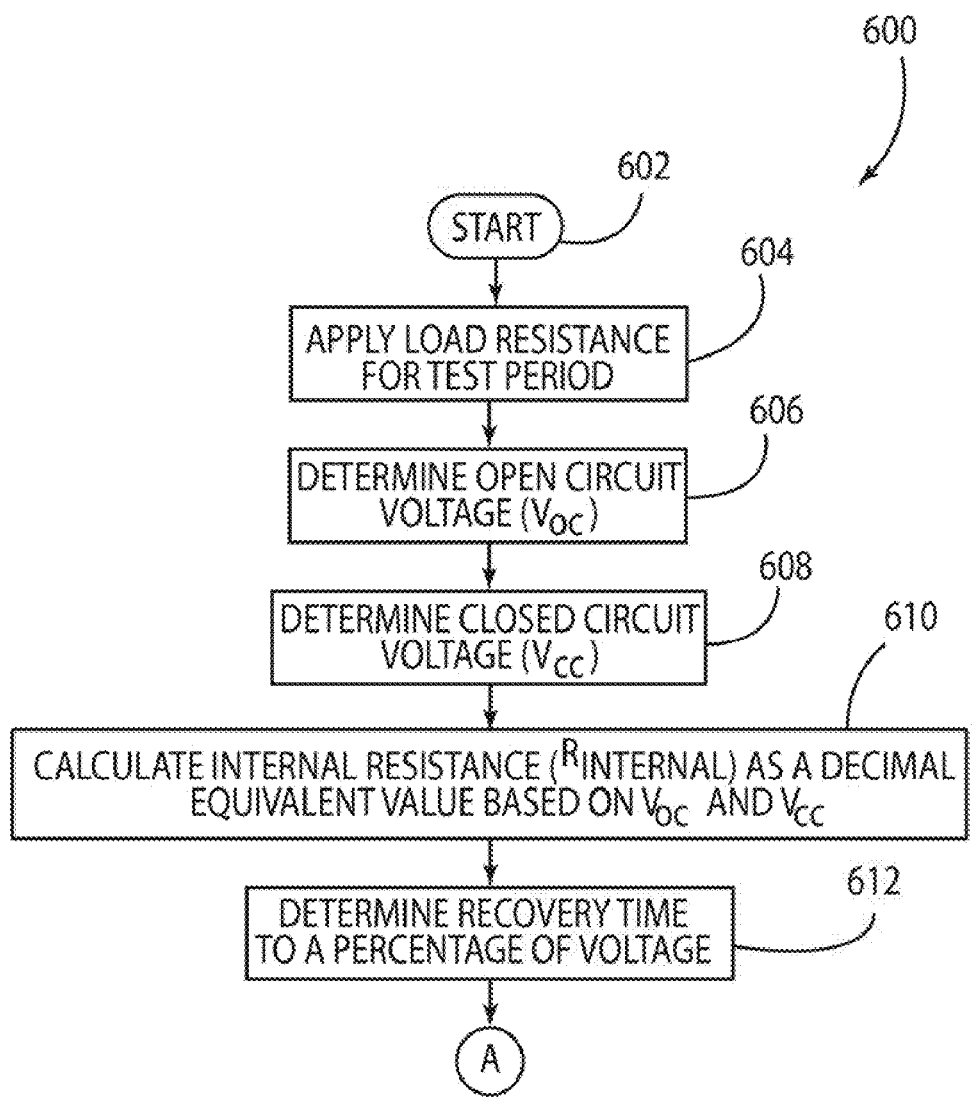

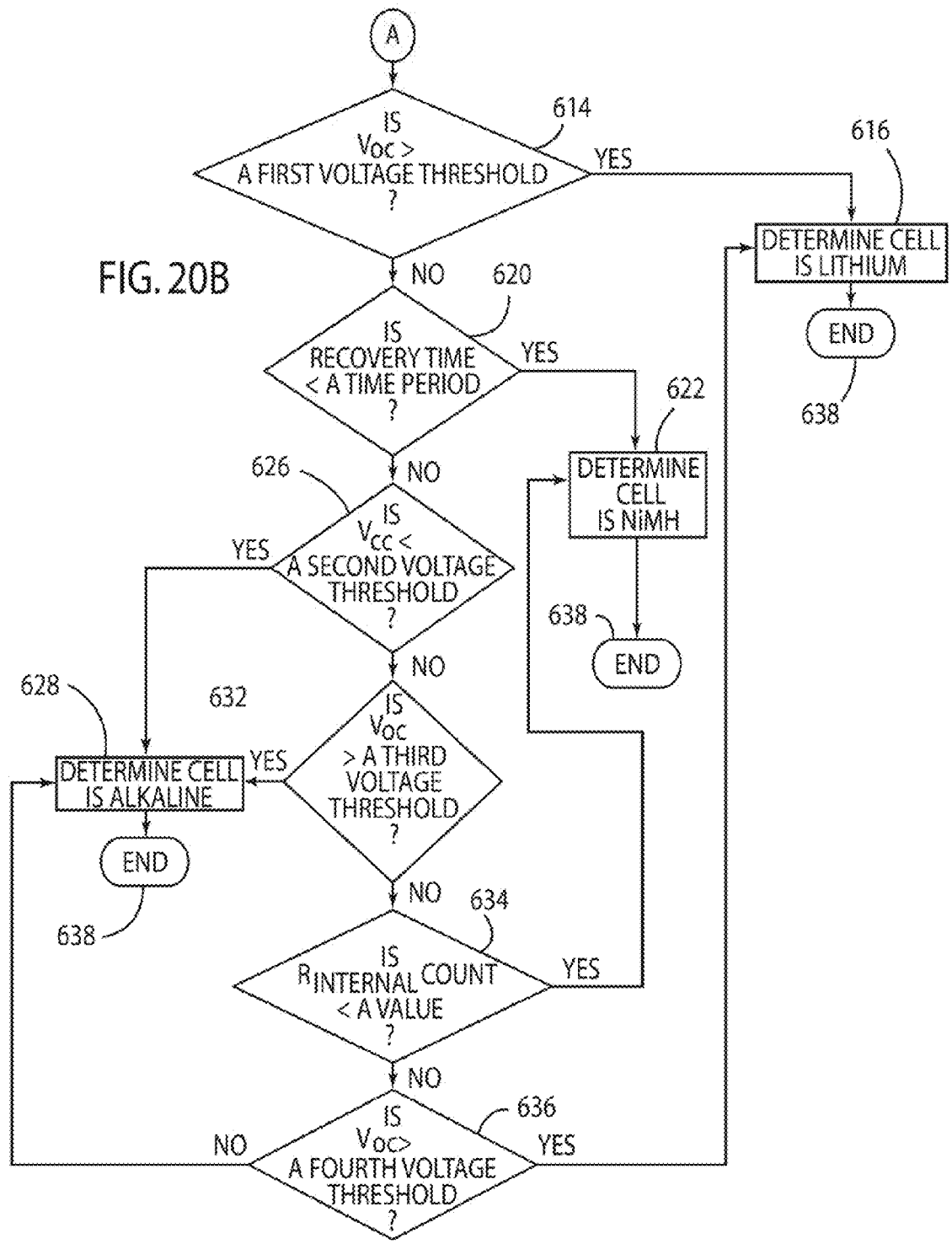

FUEL GAUGING SYSTEM AND METHOD THEREOF

CROSS-REFERENCE

This application claims the benefit under 35 U.S.C. §119 (e) of U.S. Provisional Patent Application No. 61/023,632, filed on Jan. 25, 2008, and is a continuation-in-part of U.S. patent application Ser. No. 12/177,969, filed on Jul. 23, 2008, the entire disclosures of which are hereby incorporated herein by reference.

FIELD OF THE INVENTION

The present invention generally relates to a fuel gauging system, and more particularly, to a fuel gauging device that determines a state of charge of a power source based upon a determined electrochemical composition of a power source.

BACKGROUND OF THE INVENTION

Generally, a mobile lighting device, such as a flashlight, is powered by a power source that is internal to the flashlight, such as a battery. Typically, the batteries of the flashlight device can be replaced when the state of charge of the batteries is below an adequate state of charge for providing electrical power for the light source of the flashlight. Since the flashlight is being powered by batteries, the flashlight can generally emit light while not being electrically connected to a power source that is external to the flashlight, such as an alternating current (AC) wall outlet.

Additionally, when the batteries of the flashlight have a state of charge that is below an adequate state of charge level, the batteries can be replaced with other batteries. If the removed batteries are rechargeable batteries, then the removed batteries can be recharged using an external recharging device, and re-inserted into the flashlight. When the removed batteries are not rechargeable batteries, then the non-rechargeable batteries are replaced with new batteries.

Alternatively, a flashlight may contain an electrical connector in order to connect to a specific type of power source, such as the AC wall outlet, in addition to the batteries. Typically, when the flashlight is connected to the stationary external power supply, the flashlight can continue to illuminate light, but the mobility of the flashlight is now hindered. If the flashlight is directly connected to the AC wall outlet, then the mobility of the flashlight is generally eliminated. When the flashlight is not directly connected to the AC wall outlet, such as by an extension cord, the flashlight has limited mobility.

SUMMARY OF THE INVENTION

In accordance with one aspect of the present invention, a fuel gauging system is provided that includes hardware circuitry adapted to electrically connect to a power source that has an electrochemical composition. The fuel gauging system further includes an electrochemical composition detection device, configured to determine the electrochemical composition of the power source, and a fuel gauging device configured to determine a state of charge of the power source based upon the determined electrochemical composition of the power source.

In accordance with another aspect of the present invention, a lighting device is provided that includes hardware circuitry, a lighting source, an electrochemical composition detection device, and a fuel gauging device. The hardware circuitry is adapted to electrically connect to a power source that has an electrochemical composition. The lighting source is in electrical communication with the hardware circuitry. The electrochemical composition detection device is configured to determine the electrochemical composition of the power source. The fuel gauging device is configured to determine a state of charge of the power source based upon the determined electrochemical composition of the power source.

In accordance with yet another aspect of the present invention, a method of determining a state of charge of a power source electrically connected to hardware circuitry is provided, which includes the step of determining an electrochemical composition of a power source. The method further includes the step of determining a state of charge of the power source based upon at least the determined electrochemical composition of the power source.

These and other features, advantages, and objects of the present invention will be further understood and appreciated by those skilled in the art by reference to the following specification, claims, and appended drawings.

BRIEF DESCRIPTION OF THE DRAWINGS

The present invention will now be described, by way of example, with reference to the accompanying drawings, in which:

FIG. 6 is a flow chart illustrating a method of an electrical current supplied by an external power source bypassing an internal power source of a lighting device of a lighting system, in accordance with one embodiment of the present invention;

FIG. 7C is a cross-sectional view of the handheld lighting device of the lighting system, in accordance with one embodiment of the present invention;

FIG. 8A is a front perspective view of a headlight lighting device of a lighting system, in accordance with one embodiment of the present invention;

FIG. 8B is an exploded view of the headlight lighting device of the lighting system, in accordance with one embodiment of the present invention;

FIG. 9C is a cross-sectional view of the spotlight lighting device of the lighting system, in accordance with one embodiment of the present invention;

FIG. 11A is a top perspective view of a solar power source of a lighting system in a solar radiation harvesting position, in accordance with one embodiment of the present invention;

FIG. 11C is a front perspective view of the solar power source of the lighting system in a rolled-up position, in accordance with one embodiment of the present invention;

FIG. 12A is a front perspective view of an electrical connector of a lighting system, in accordance with one embodiment of the present invention;

FIG. 12B is an exploded view of the electrical connector of the lighting system, in accordance with one embodiment of the present invention;

FIG. 12C is a cross-sectional view of the electrical connector of the lighting system, in accordance with one embodiment of the present invention;

FIG. 13 is a flow chart illustrating a method of determining an electrochemical composition of a power source of a device or system of a lighting system, in accordance with one embodiment of the present invention;

FIGS. 20A and 20B are flow diagrams illustrating a routine for determining the electrochemical composition of a power source of a device or system of a lighting system, in accordance with another embodiment of the present invention.

DETAILED DESCRIPTION OF PREFERRED EMBODIMENTS

Figure 1:
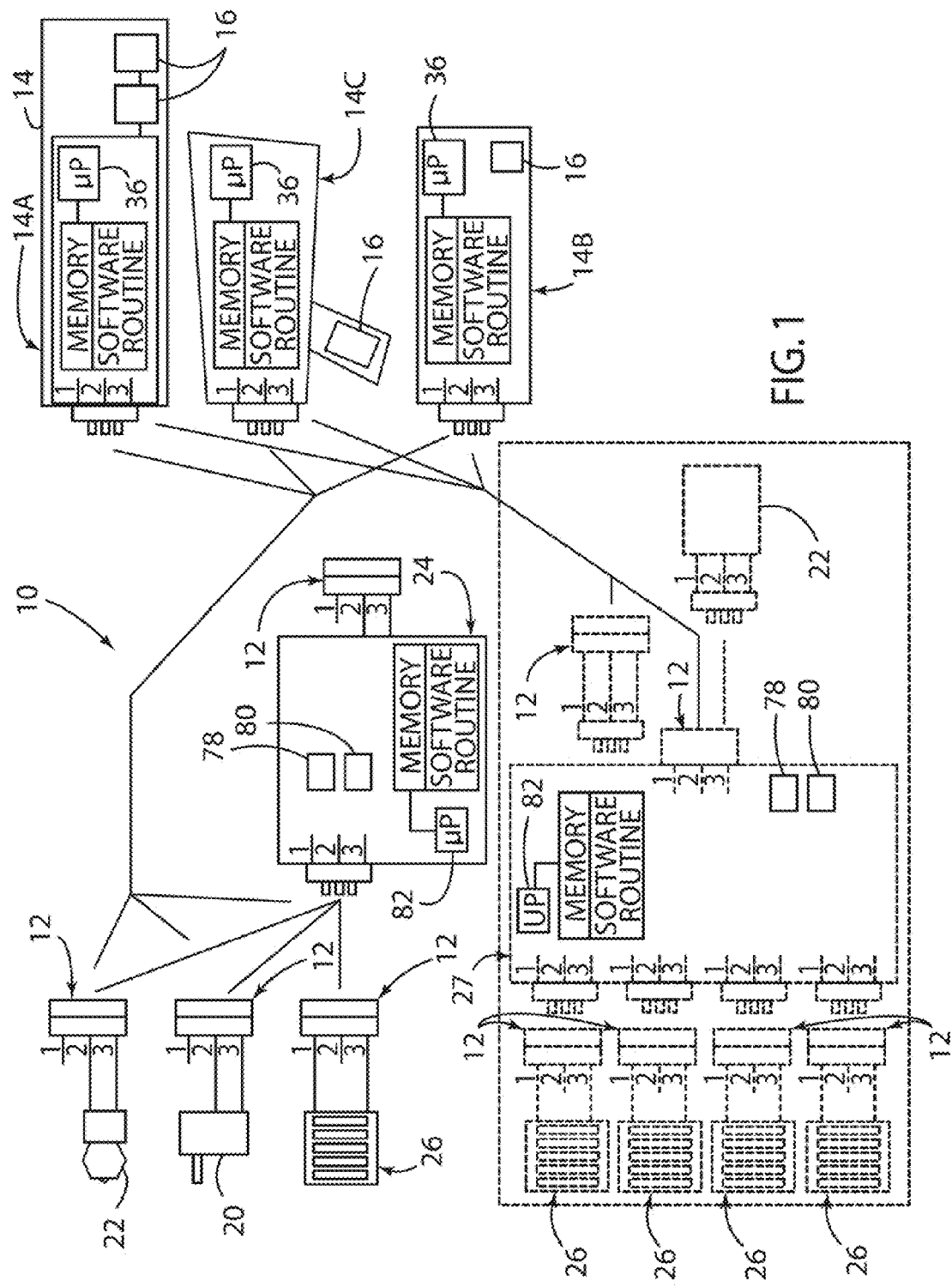
FIG. 1 is a schematic view of a lighting system having a plurality of lighting devices and a plurality of external power sources, in accordance with one embodiment of the present invention.

Before describing in detail embodiments that are in accordance with the present invention, it should be observed that the embodiments include combinations of method steps and apparatus components related to a lighting system and method of operating thereof. Accordingly, the apparatus components and method steps have been represented, where appropriate, by conventional symbols in the drawings, showing only those specific details that are pertinent to understanding the embodiments of the present invention so as not to obscure the disclosure with details that will be readily apparent to those of ordinary skill in the art having the benefit of the description herein. Further, like reference characters in the description and drawings represent like elements.

In this document, relational terms, such as first and second, top and bottom, and the like, may be used to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

I. Lighting System

In reference to FIGS. 1-12, a lighting system is generally shown at reference identifier 10. The lighting system 10 includes at least one lighting device 14, at least one electrical connector generally indicated at 12, and one or more power sources 16,20,22,24,26,27. According to one embodiment, the at least one lighting device includes a handheld lighting device generally indicated at 14A, a headlight lighting device generally indicated at 14B, and a spotlight lighting device generally indicated at 14C. For purposes of explanation and not limitation, the invention is generally described herein with regards to the at least one lighting device including the handheld lighting device 14A, the headlight lighting device 14B, and the spotlight lighting device 14C; however, it should be appreciated by those skilled in the art that the lighting system 10 can include a combination of the lighting devices 14A, 14B, 14C and/or additional lighting devices. The at least one lighting device typically includes at least one lighting source and an internal power source, generally indicated at 16, that supplies a first electrical current to illuminate the at least one lighting source, as described in greater detail herein. However, it should be appreciated by those skilled in the art that other embodiments include devices that emit the at least one lighting device 14A, 14B, 14C and/or the internal power source 16. According to one embodiment, the lighting system 10 can include non-lighting devices, such as, but not limited to, a weather radio, a global positioning satellite (GPS) system receiver, an audio player, a cellular phone, the like, or a combination thereof.

According to one embodiment, the at least one lighting source includes a white flood light emitting diode (LED) 18A, a white spot LED 18B, and a red flood LED 18C. Typically, the white flood LED 18A and white spot LED 18B emit a white light having two different illumination patterns, wherein the white flood LED 18A illumination pattern disperses the emitted light over a greater area than the white spot LED 18B, as described in greater detail below. It should be appreciated by those skilled in the art that the white flood LED 18A, white spot LED 18B, and red flood LED 18C can be any desirable color, such as, but not limited to, white, red, blue, suitable colors of light in the visible light wavelength spectrum, infrared, suitable colors of light in the non-visible light wavelength spectrum, the like, or a combination thereof.

According to one embodiment, the flood beam pattern illuminates a generally conical shaped beam having a circular cross-section with a target size in diameter of approximately two meters (2 m) or greater at a target distance of approximately one hundred meters (100 m), and the spot beam pattern illuminates a generally conical shaped beam having a circular cross-section with a target size in diameter of approximately less than one meter (1 m) at a target distance of two meters (2 m). Thus, the flood beam pattern can be defined as the light being emitted at a half angle of twelve degrees (12°) or greater with respect to the lighting source 18A, and the spot beam pattern can be defined as the light being emitted at a half angle of less than twelve degrees (12°) with respect to the lighting source 18B. According to one embodiment, the spot lighting source 18B can have a half angle of less than or equal to approximately five degrees (5°) for the handheld and headlight lighting devices 14A, 14B, and a half angle of less than or equal to approximately two degrees (2°) for the spotlight lighting device 14C. The red flood LED 18C can have a similar illumination pattern to the white flood LED 18A while emitting a red-colored light. According to one embodiment, the term illumination pattern generally refers to the size and shape of the illuminated area at a target distance, angles of the emitted light, the intensity of the emitted light across the beam, the illuminance of the beam (e.g., the total luminous flux incident on a surface, per unit area), or a combination thereof. The shape of the illumination pattern can be defined as the target area containing approximately eighty percent to eighty-five percent (80%-85%) of the emitted light.

It should be appreciated by those skilled in the art that the flood and/or the spot illumination patterns can form or define shapes other than circles, such as, but not limited to, ovals, squares, rectangles, triangles, symmetric shapes, non-symmetric shapes, the like, or a combination thereof. It should further be appreciated by those skilled in the art that the lighting sources 18A, 18B, 18C can be other combinations of lighting sources with different illumination patterns, such as, but not limited to, two or more flood lighting sources, two or more spot lighting sources, or a combination thereof.

For purposes of explanation and not limitation, the invention is generally described herein with regards to the at least one lighting source including the white flood LED 18A, the white spot LED 18B, and the red flood LED 18C. However, it should be appreciated by those skilled in the art that the lighting system 10 can include lighting devices 14A, 14B, 14C having a combination of lighting sources 18A, 18B, 18C and/or additional lighting sources. According to one embodiment, the light sources 18A, 18B, 18C are connected to a LED circuit board 19, as described in greater detail below.

The plurality of power sources include a plurality of external power sources, wherein the plurality of external power sources include at least first and second external power sources that are adapted to be electrically connected to the at least one lighting device by the at least one electrical connector 12. Typically, the electrical connector 12 electrically connects the external power source to the lighting device 14A, 14B, 14C. By way of explanation and not limitation, the plurality of external power sources can include an alternating current (AC), such as a 120 Volt wall outlet, power source 20, a direct current (DC) power source 22, such as an outlet in a vehicle, an energy storage system generally indicated at 24, a solar power source 26, a solar power energy storage system 27, the like, or a combination thereof. It should be appreciated by those skilled in the art that other types of external power sources can be configured to connect with the lighting device 14A, 14B, 14C.

For purposes of explanation and not limitation, the handheld lighting device 14A can be adapted to be held by a single hand of a user, wherein the hand of the user wraps around the longitudinally extending handheld lighting device 14A. Thus, a thumb of the user's hand is positioned to actuate at least one switch SW1, SW2, SW3, or SW4, which alters the light emitted by the handheld lighting device 14A, as described in greater detail herein. The headlight lighting device 14B can be adapted to be placed over a user's head using a headband 21, wherein the user actuates the at least one switch SW1, SW2, SW3, or SW4 using one or more fingers of the user's hand in order to alter the light emitted from the headlight lighting device 14B, as described in greater detail herein. Thus, a user generally directs the light emitted by the headlight lighting device 14B by moving their head. Additionally or alternatively, the spotlight lighting device 14C is adapted to be held in the hand of a user, wherein the user's hand wraps around a handle portion 17 of the spotlight lighting device 14C. Typically, a user's hand is positioned on the handle portion 17, such that an index finger of the user's hand can actuate switches SW1, SW2, or SW3, and a middle finger of the user's hand can be used to actuate switch SW4, which alters the light emitted by the spotlight lighting device 14C, as described in greater detail herein. Generally, the spotlight lighting device 14C illuminates objects with the light emitted from the lighting source 18B at a greater distance than objects illuminated by light emitted from the handheld lighting device 14A and headlight lighting device 14B.

Typically, the lighting devices 14A, 14B, 14C include the internal power source 16, and are electrically connected to the external power sources 20, 22, 24, 26, or 27 by the electrical connector 12. The lighting devices 14A, 14B, 14C can be electrically connected to the external power sources 20, 22, 24, 26, or 27 at the discretion of the user of the lighting system 10, such that the lighting devices 14A, 14B, 14C are not consuming electrical power from the internal power source 16 when the lighting devices 14A, 14B, 14C are electrically connected to one of the external power sources 20, 22, 24, 26, or 27. Thus, if a user does not desire to consume the electrical power of the internal power source 16 or the state of charge of the internal power source 16 is below an adequate level, the user can electrically connect one of the external power sources 20,22, 24,26, or 27 to the lighting device 14A,14B,14C, such that the electrically connected power source 20,22,24,26, or 27 supplies an electrical current to the lighting source 18A,18B, 18C, according to one embodiment. Further, one or more of the external power sources can be a rechargeable power source that can be charged by other external power sources of the lighting system 10, or other power sources external to the lighting system 10.

According to one embodiment, the first external power source supplies a second electrical current to the at least one lighting device to illuminate the at least one lighting source 18,18B, 18C, and the second external power source supplies a third electrical current to illuminate the at least one lighting source 18A,18B,18C, such that the internal power source 16 and one of the plurality of external power sources each supply electrical current to illuminate the at least one lighting source 18A,18B,18C at different times, as described in greater detail herein. The first, second, and third electrical currents are supplied at at least two different voltage potentials. According to one embodiment, the AC power source 20 receives electrical current from an AC source at a voltage potential ranging from substantially ninety Volts (90 VAC) to two hundred forty Volts (240 VAC) at fifty hertz (50 Hz) or sixty hertz (60 Hz), and supplies an electrical current to the lighting devices 14A,14B,14C at a voltage potential of about substantially 12 Volts, the DC power source 22 supplies the electrical current at a voltage potential of about substantially 12 Volts, the energy storage system 24 and solar power energy storage system 27 supply the electrical current at a voltage potential of about substantially 3.6 Volts, and the solar power source 26 supplies the electrical current at a voltage potential of substantially 8 Volts. According to one embodiment, the internal power source 16 can be an electrochemical cell battery configured as a 1.5 Volt power source, such as, but not limited to, an alkaline battery, a nickel metal hydride (NiMH) battery, or the like. Alternatively, the internal power source 16 can be an electrochemical cell battery configured as a 3.6 Volt-3.7 Volt power source, such as a lithium ion (Li-Ion) battery, or the like. Thus, the lighting devices 14A,14B,14C can be supplied with an electrical current having a voltage potential ranging from and including approximately 1.5 Volts to 12 Volts in order to illuminate the lighting sources 18A,18B,18C.

Figure 2A:
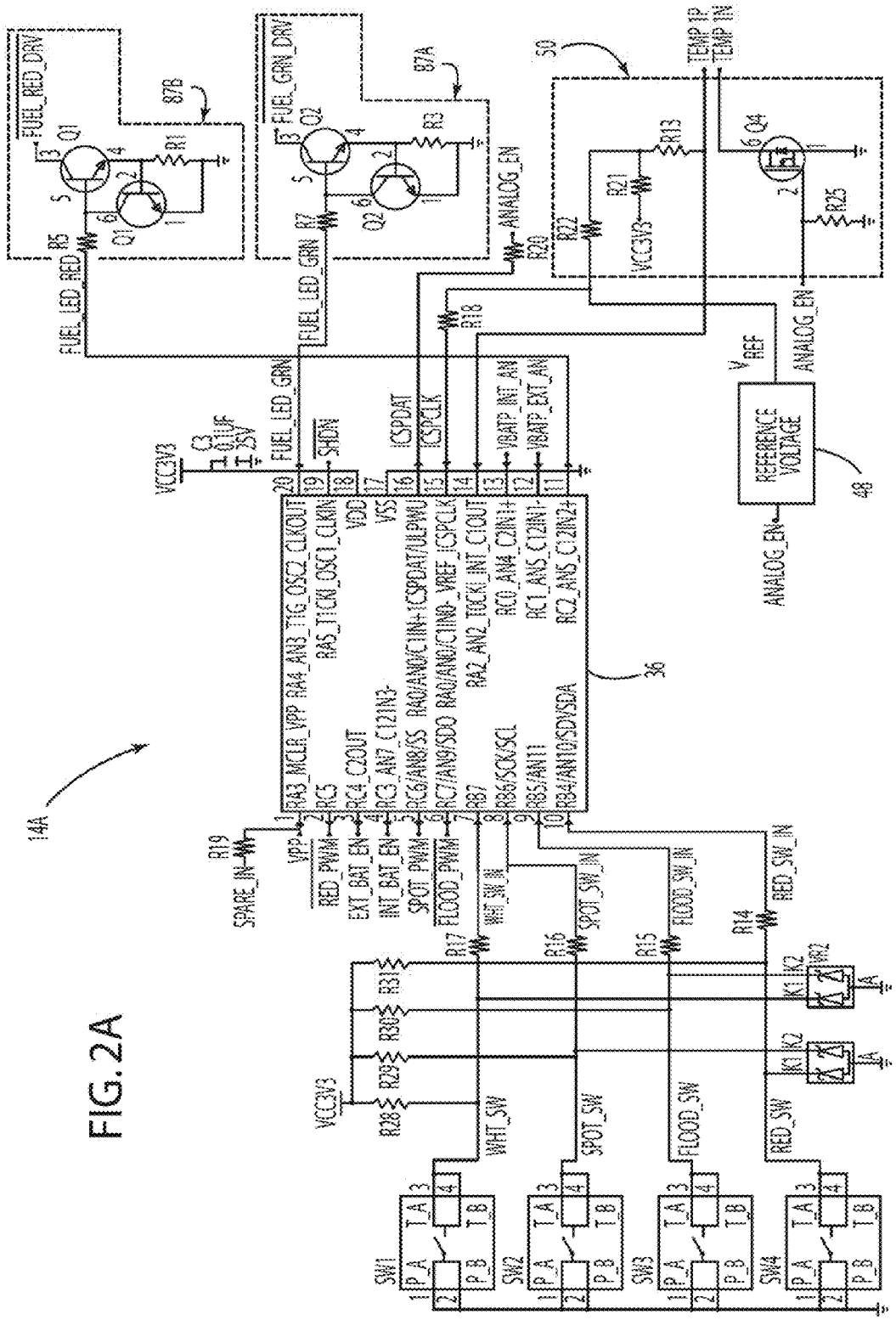
FIG. 2A is a circuit diagram of a handheld lighting device of a lighting system, in accordance with one embodiment of the present invention.
Figure 2B:
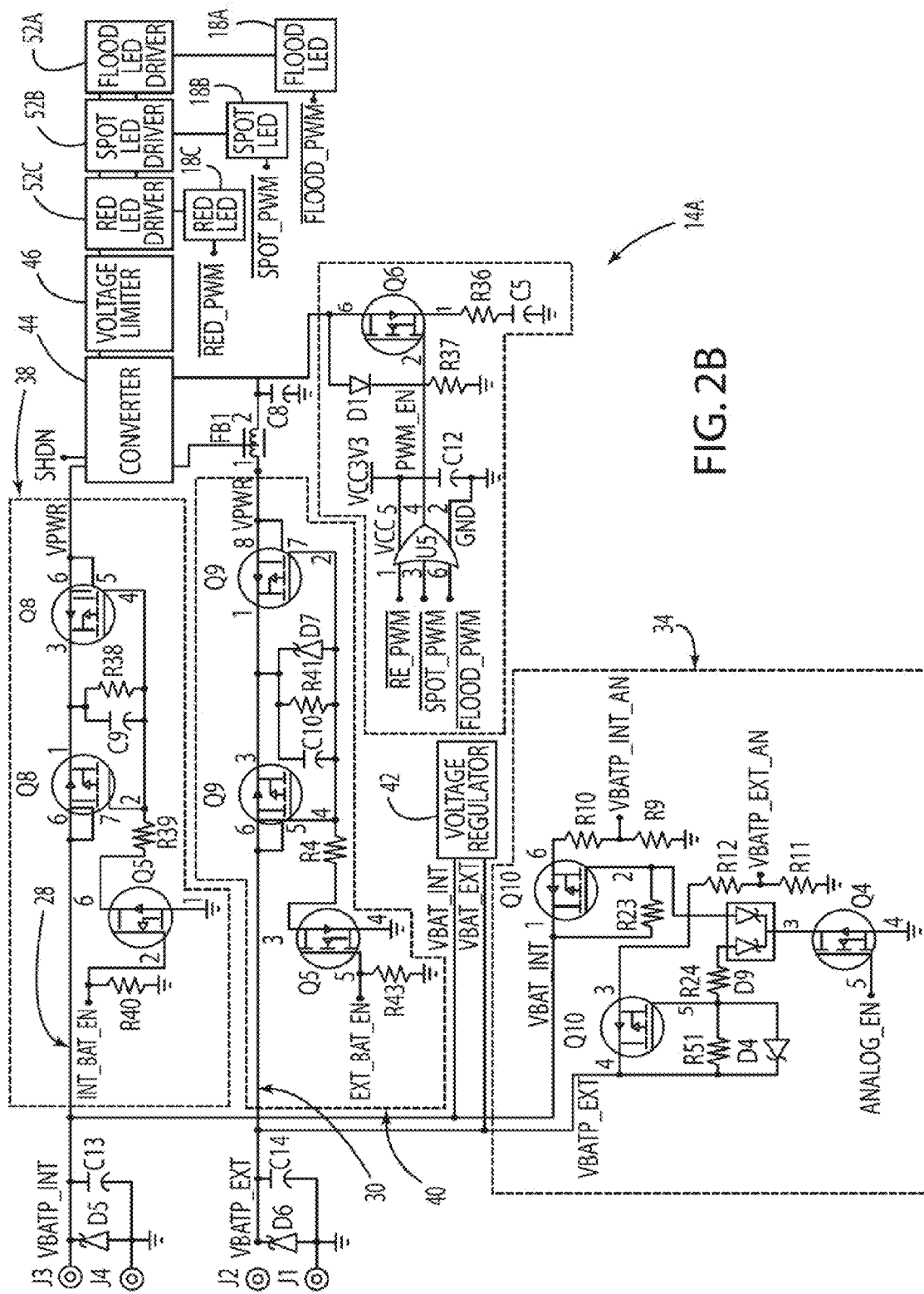
FIG. 2B is a circuit diagram of the handheld lighting device of the lighting system, in accordance with one embodiment of the present invention.
Figure 3A:
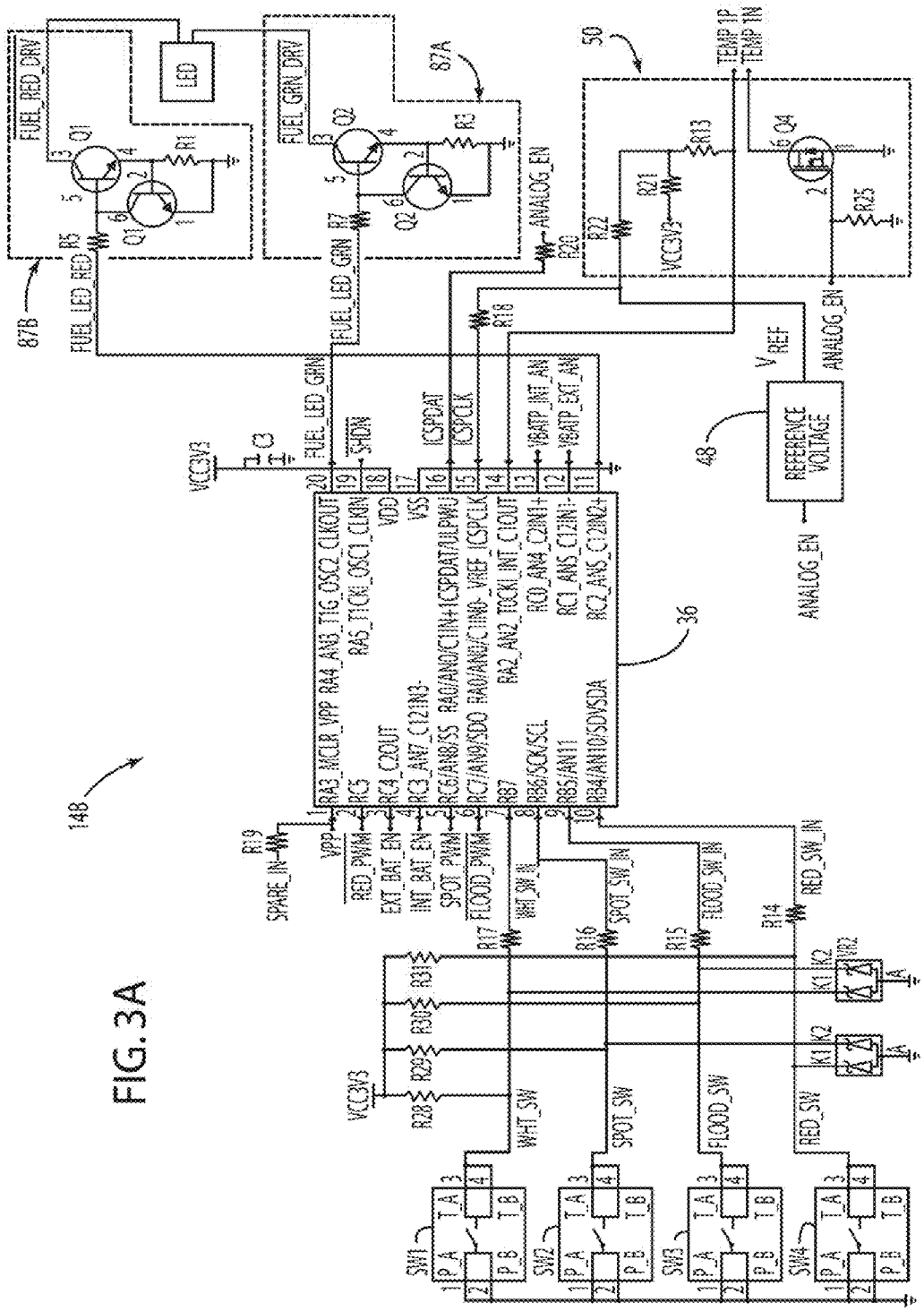
FIG. 3A is a circuit diagram of a headlight lighting device of a lighting system, in accordance with one embodiment of the present invention.
Figure 3B:
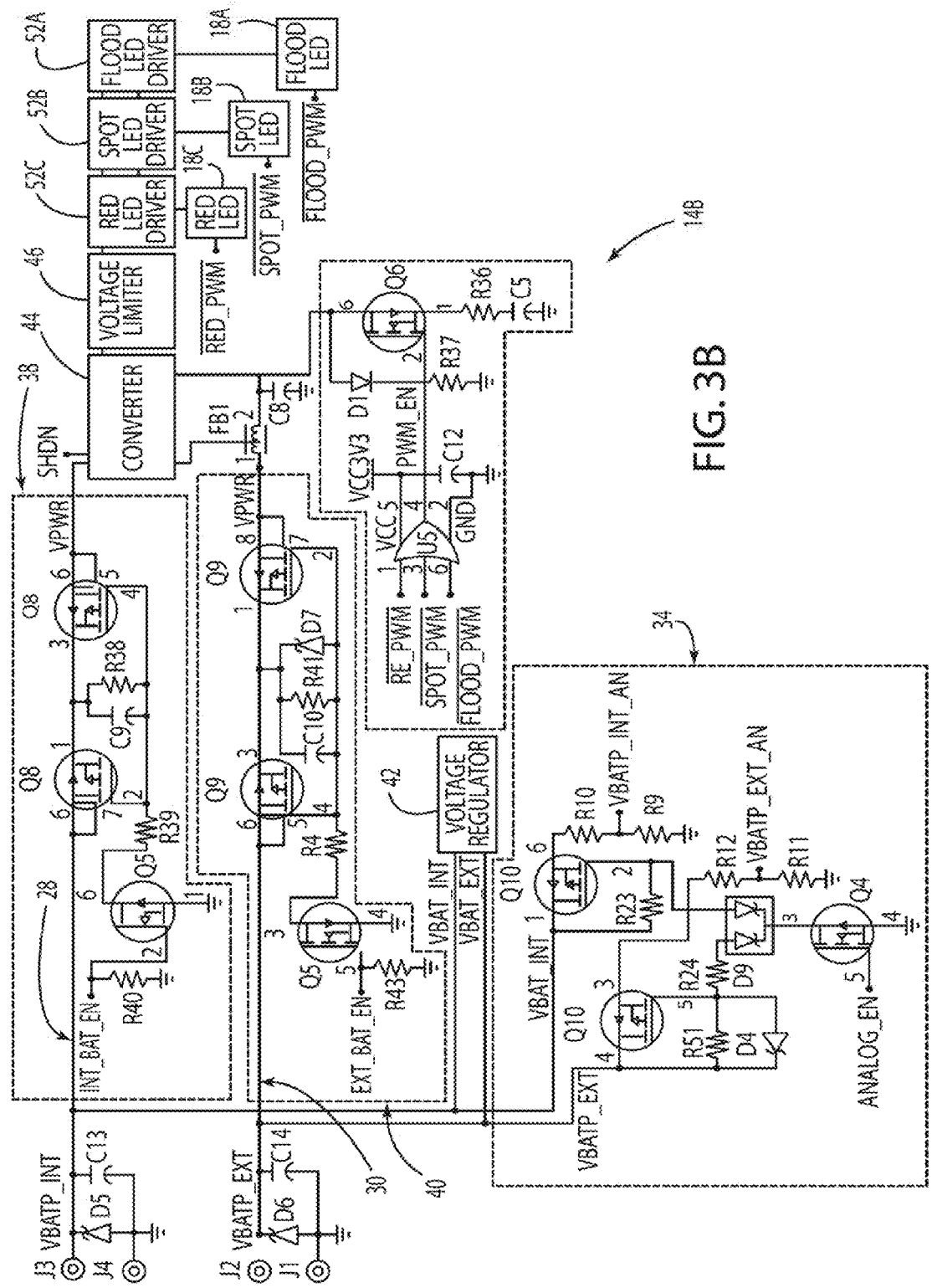
FIG. 3B is a circuit diagram of the headlight lighting device of the lighting system, in accordance with one embodiment of the present invention.
Figure 4A:
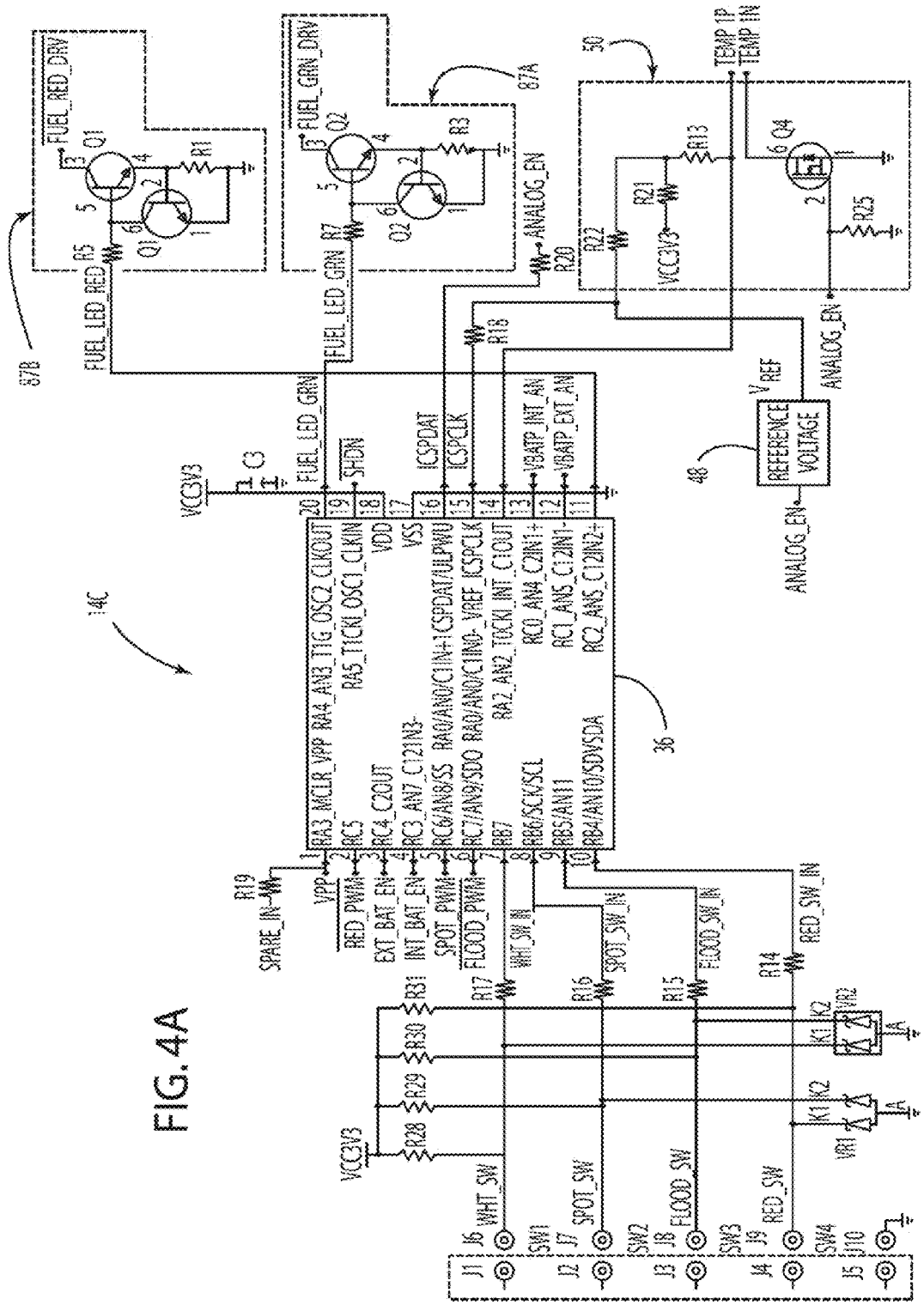
FIG. 4A is a circuit diagram of a spotlight lighting device of a lighting system, in accordance with one embodiment of the present invention.
Figure 4B:
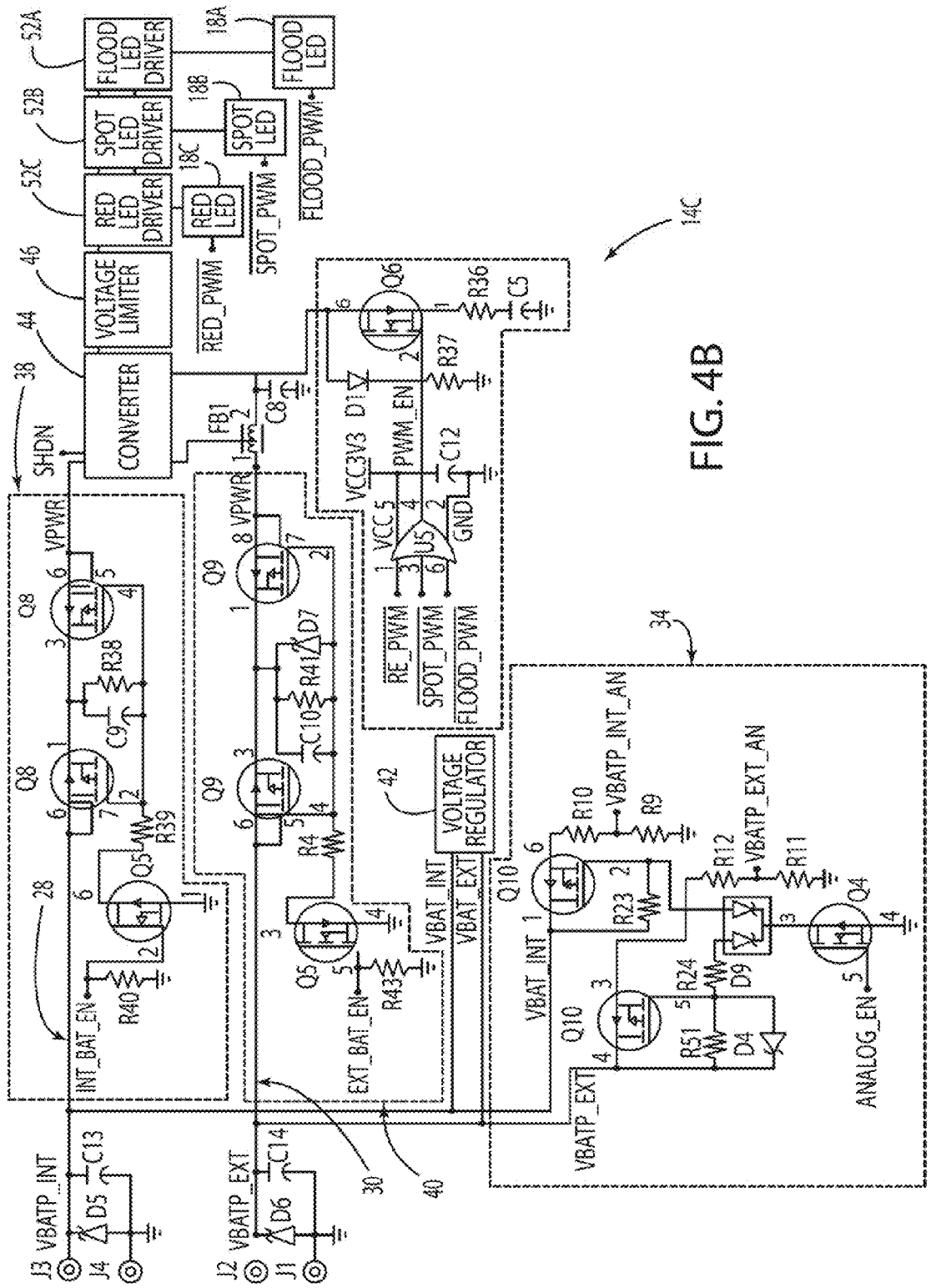
FIG. 4B is a circuit diagram of the spotlight lighting device of the lighting system, in accordance with one embodiment of the present invention.
Figure 5A:
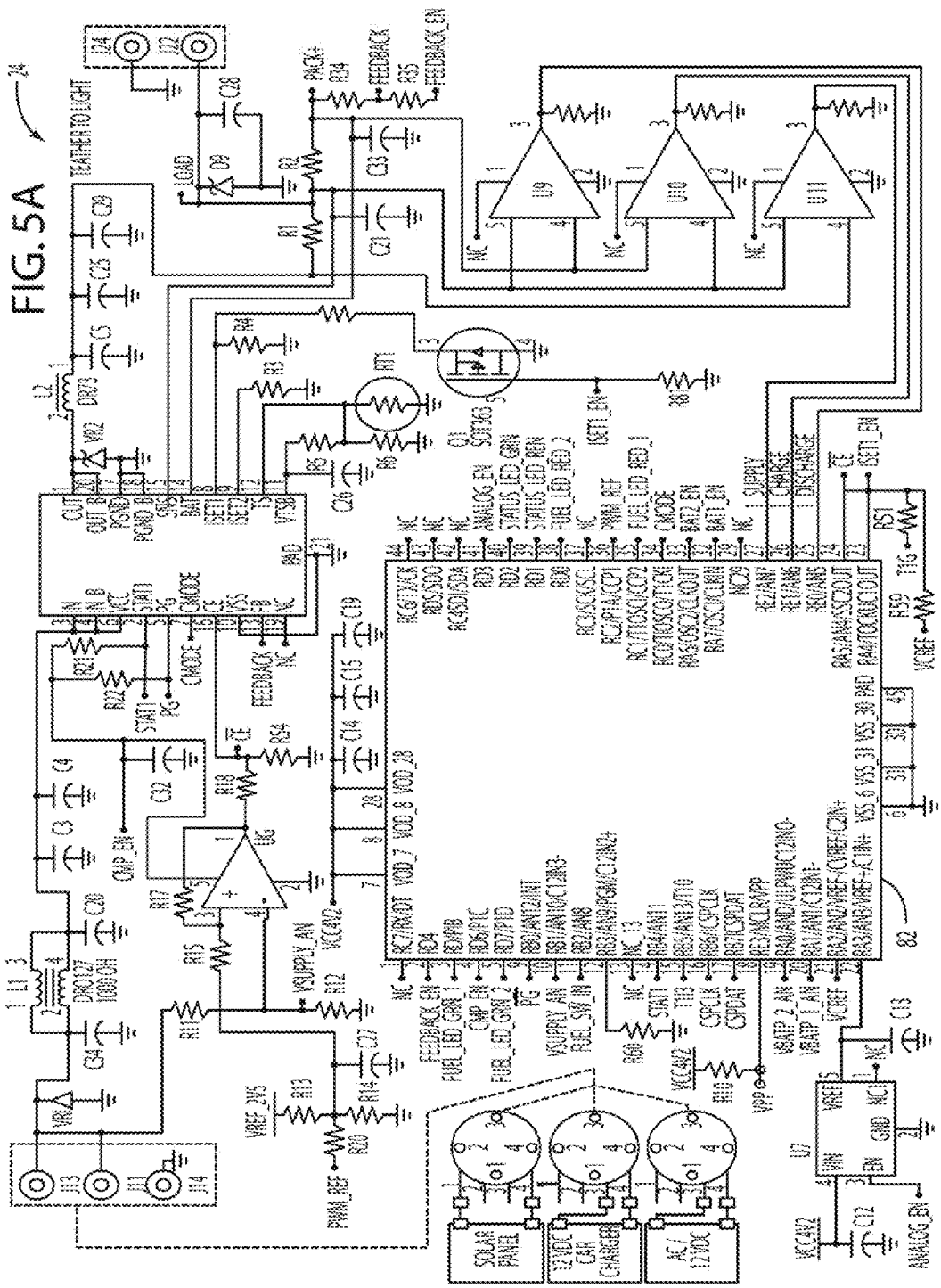
FIG. 5A is a circuit diagram of an energy storage system of a lighting system, in accordance with one embodiment of the present invention.
Figure 5B:
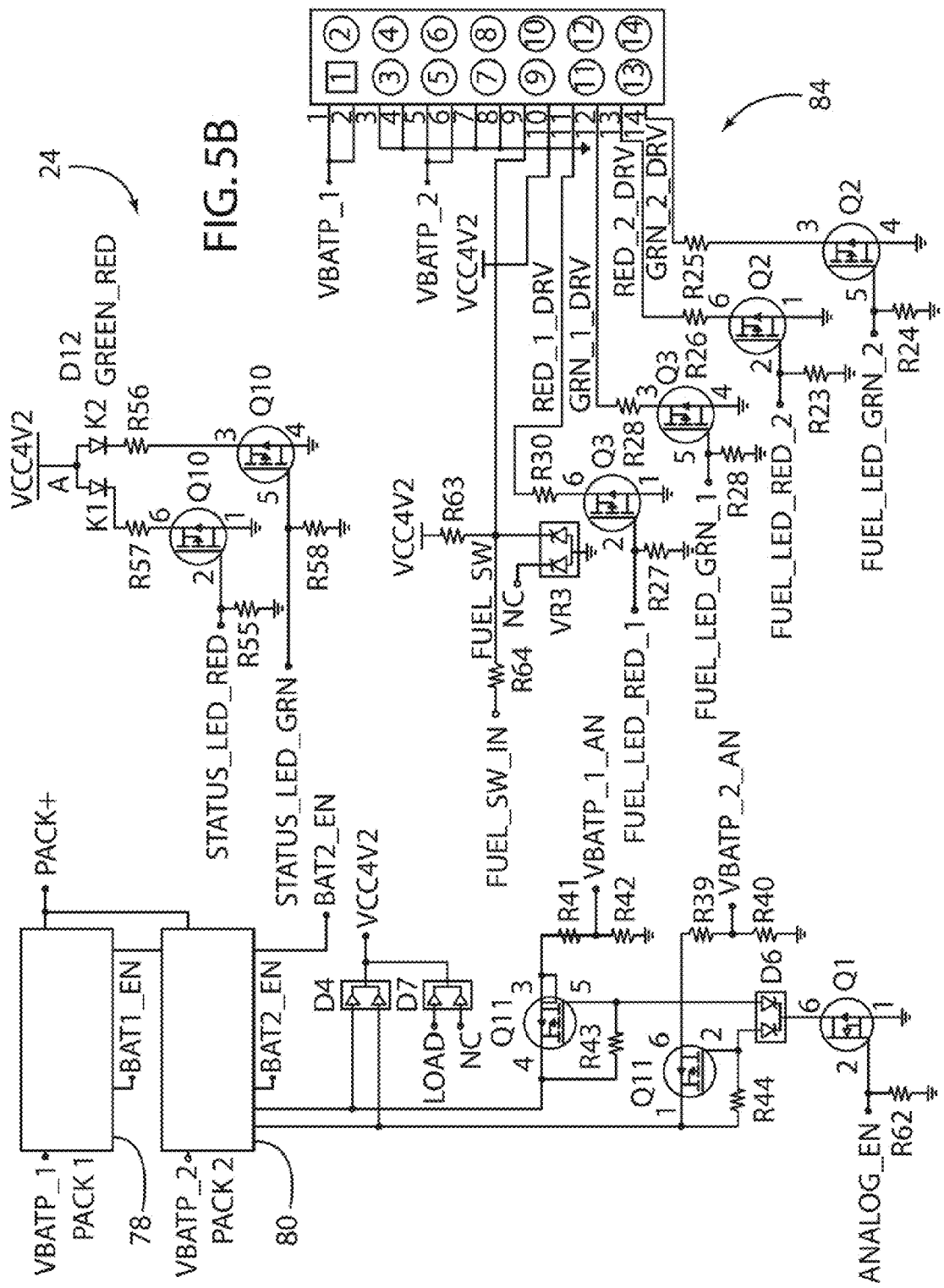
FIG. 5B is a circuit diagram of the energy storage system of the lighting system, in accordance with one embodiment of the present invention.
Figure 7A:
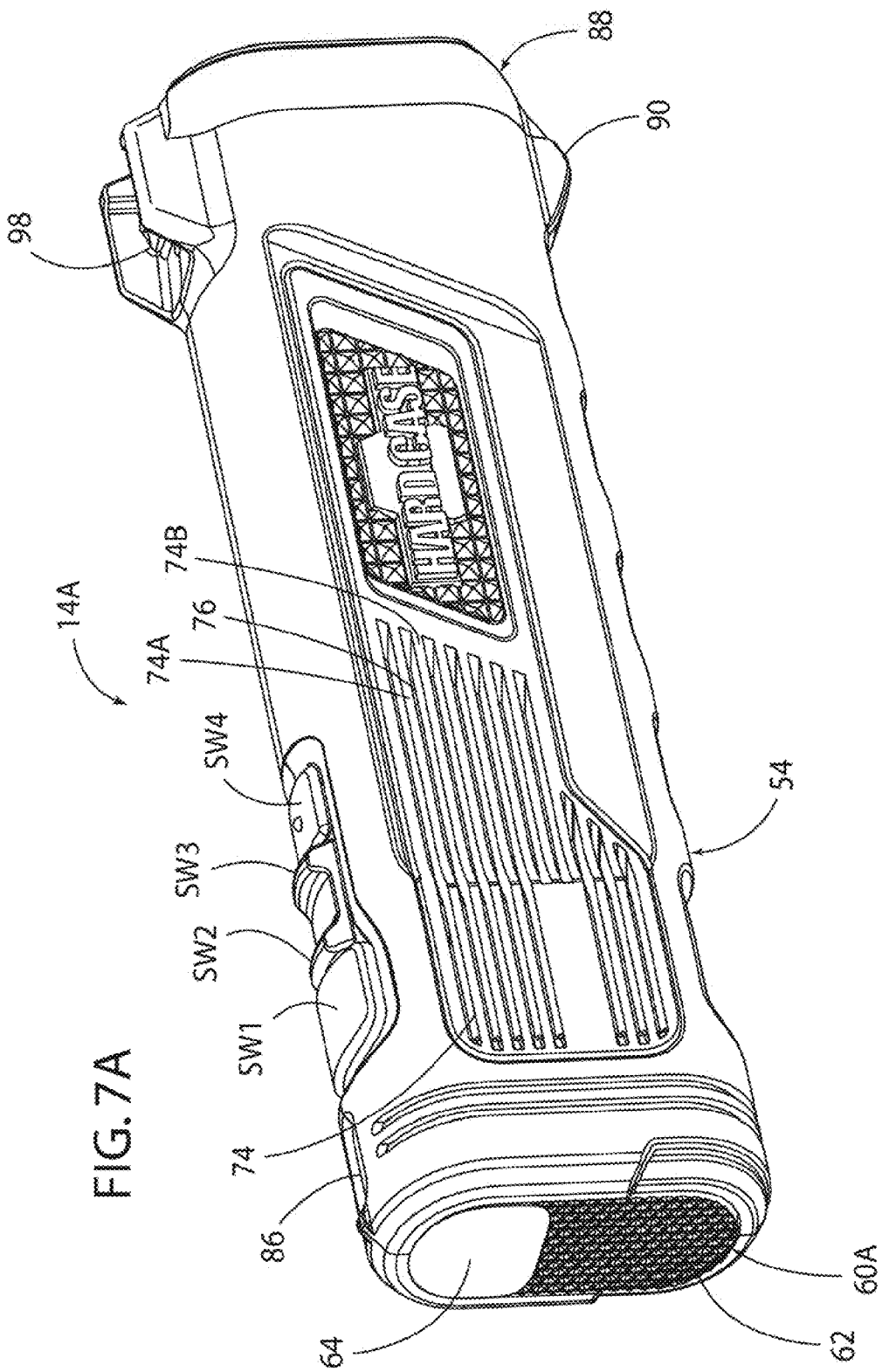
FIG. 7A is front perspective view of a handheld lighting device of a lighting system, in accordance with one embodiment of the present invention.
Figure 7B:
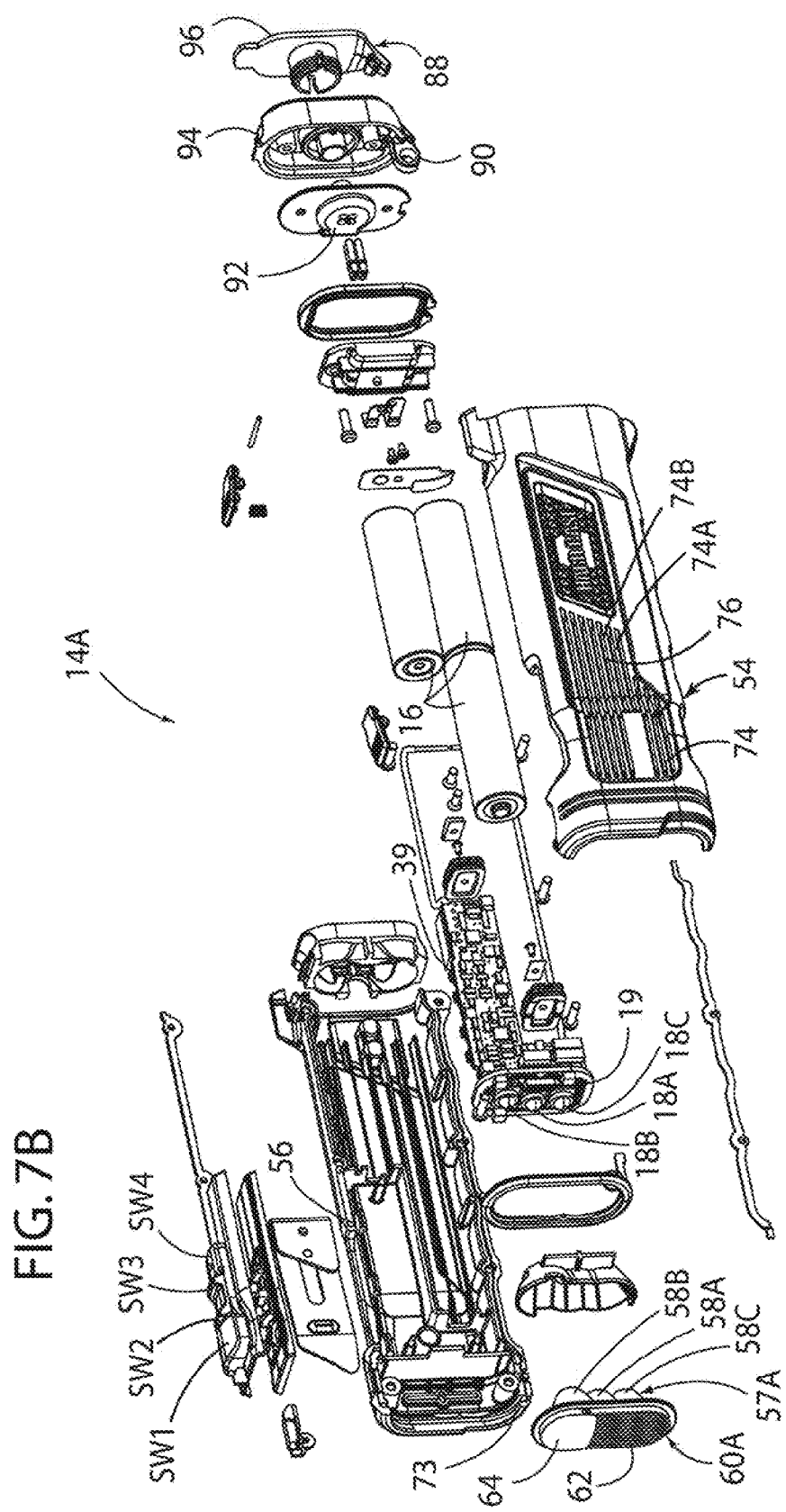
FIG. 7B is an exploded view of the handheld lighting device of the lighting system, in accordance with one embodiment of the present invention.

According to one embodiment, the lighting devices 14A, 14B,14C can each include a first electrical path generally indicated at 28, and a second electrical path generally indicated at 30, wherein both the first electrical path 28 and second electrical path 30 are internal to the lighting device 14A,14B,14C (FIGS. 2B, 3B, and 4B). Typically, the internal power source 16 provides the electrical current to the lighting source 18A,18B,18C through the first electrical path 28, and the plurality of external power sources 20,22,24,26,27 supply the electrical current via the electrical connector 12 to the lighting source 18A,18B,18C through the second electrical path 30, such that the second electrical path 30 bypasses the first electrical path 28. According to an alternate embodiment, the external power sources 20,22,24,26,27, when connected to the lighting device 14A, 14B, 14C, supply the electrical current via the electrical connector 12 through the second electrical path 30 to illuminate the lighting element 18A,18B, 18C and supply an electrical current to the internal power source 16 to recharge the internal power source. It should be appreciated by those skilled in the art that in such an embodiment, the internal power source 16 is a rechargeable power source (FIG. 1). According to another embodiment, the lighting device 14A,14B,14C is not configured to be electrically connected to the external power sources 20,22,24,26,27, and thus, is not adapted to be connected to the connector 12.

The lighting devices 14A,14B,14C typically include the internal power source 16 and are configured to connect to one of the external power sources 20,22,24,26, or 27 at a time. A battery voltage monitor generally indicated at 34 is in electrical communication with the internal power source 16 and the external power sources 20,22,24,26,27, when one of the external power sources 20,22,24,26, or 27 is connected. The battery voltage monitor 34 determines if the internal power source 16 and external power source 20,22,24,26,27 have a voltage potential. According to one embodiment, a processor or microprocessor 36 powers or turns on transistors Q10 of the battery voltage monitor 34, so that the lighting device 14A,14B, or 14C can determine if the internal power source 16 or the connected external power source 20,22,24,26, or 27 has a voltage potential. Thus, the battery voltage monitor 34 activates a switch to turn on one of an internal battery selector, generally indicated at 38, or an external battery selector, generally indicated at 40. According to one embodiment, the internal battery selector 38 is turned on by switching transistors Q8, which can be back-to-back field-effect transistors (FETs), and the external battery selector 40 is turned on by switching transistors Q9, which can be back-to-back FETs.

In regards to FIGS. 1-6, a method of supplying electrical current from the power sources 16,20,22,24,26,27 is generally shown in FIG. 6 at reference identifier 1000. The method 1000 starts at step 1002, and proceeds to step 1004, wherein the at least one switch SW1 or SW4 is actuated, according to one embodiment. At step 1006, the voltage potential of at least one of the power sources 16,20,22,24,26,27 are determined. At decision step 1008, it is determined if an external power source 20,22,24,26,27 is connected to the lighting device 14A,14B,14C. According to one embodiment, the external power sources 20,22,24,26,27 have a greater voltage potential than the internal power source 16 when the external power source 20,22,24,26,27 is charged (e.g., energy storage system 24), and thus, by determining the voltage potential of the power sources 16,20,22,24,26,27 at step 1006, when there are multiple determined voltage potentials, then the higher voltage potential is assumed to be the external power source 20,22,24,26,27.

If it is determined at decision step 1008 that there is not an external power source 20,22,24,26, or 27 connected to the lighting device 14A,14B,14C, then the method 1000 proceeds to step 1010, wherein the internal battery selector 38 is turned on. At step 1012, electrical current is supplied from the internal power source 16 to a lighting source 18A,18B,18C through the first electrical path 28, and the method 1000 then ends at step 1014. However, if it is determined at decision step 1008 that one of the external power sources 20,22,24,26, or 27 is connected to the lighting device 14A,14B,14C, then the method 1000 proceeds to step 1016, wherein the external battery selector 40 is turned on. At step 1018, electrical current is supplied from the external power source 20,22,24,26, or 27 to the lighting source 18A,18B,18C through the second electrical path 30, and the method 1000 then ends at step 1014. It should be appreciated by those skilled in the art that if the external power source 20,22,24,26, or 27 is connected to the lighting device 14A,14B,14C, after the switch SW1 or SW4 has been actuated to turn on the lighting source 18A, 18B,18C, then the method 1000 starts at step 1002, and proceeds directly to step 1006, wherein the voltage potential of the power sources 16,20,22,24,26,27 is determined.

With regards to FIGS. 1-5 and 7-11, the lighting devices 14A,14B,14C can include a voltage regulator 42 (FIGS. 2B, 3B, and 4B). According to one embodiment, the voltage regulator 42 is a 3.3 voltage regulator, wherein the voltage regulator 42 receives an electrical current from the internal power source 16, the external power source 20,22,24,26, or 27, or a combination thereof. Typically, the voltage regulator 42 determines which of the internal power source 16 and the external power source 20,22,24,26,27 have a higher voltage potential, and uses that power source 16,20,22,24,26, or 27 to power the processor 36. However, it should be appreciated by those skilled in the art that the voltage regulator 42 can include hardware circuitry, execute one or more software routines, or a combination thereof to default to the internal power source 16 or the external power source 20,22,24,26,27, when present, to power the processor 36. Thus, the voltage regulator 42 regulates the voltage of the selected power source 16,20,22,24,26,27 to supply electrical power at a regulated voltage potential to the processor 36.

Additionally or alternatively, the lighting devices 14A, 14B,14C can include a converter 44, a voltage limiter 46, at least one LED driver, a reference voltage device 48, at least one fuel gauge driver, a temperature monitor device generally indicated at 50, or a combination thereof, as described in greater detail herein. The processor 36 can communicate with a memory device to execute one or more software routines, based upon inputs received from the switches SW1,SW2, SW3,SW4, the temperature monitor device 50, the like, or a combination thereof. According to one embodiment, the converter 44 is a buck-boost converter that has an output DC voltage potential from the input DC voltage potential, and the voltage limiter 46 limits the voltage potential of the electrical current supplied to the lighting sources 18A,18B,18C to suitable voltage potentials. The plurality of LED drivers can include, but are not limited to, a flood LED driver 52A, a spot LED driver 52B, and a red LED driver 52C that corresponds to the respective lighting source 18A,18B,18C. According to one embodiment, the reference voltage device 48 supplies a reference voltage potential of 2.5 Volts to the processor 36 and temperature monitor device 50.

According to one embodiment, the lighting devices 14A, 14B,14C, the AC power source 20, the DC power source 22, or a combination thereof include components that are enclosed in a housing generally indicated at 54. Additionally or alternatively, the energy storage system 24, the solar power source 26, the solar energy storage system 27, or a combination thereof can include components that are enclosed in the housing 54. According to one embodiment, the housing 54 is a two-part housing, such that the housing 54 includes corresponding interlocking teeth 56 that extend along at least a portion of the connecting sides of the housing 54. According to one embodiment, the interlocking teeth 56 on a first part of the two-part housing interlock with corresponding interlocking teeth 56 of a second part of the two-part housing in order to align the corresponding parts of the housing 54 during assembly of the device. The interlocking teeth 56 can also be used to secure the parts of the housing 54. However, it should be appreciated by those skilled in the art that additional connection devices, such as mechanical connection devices (e.g., threaded fasteners) or adhesives, can be used to connect the parts of the housing 54. Further, the interlocking teeth 56 can be shaped, such that a force applied to a portion of the housing 54 is distributed to other portions of the two-part housing 54 along the connection point of the interlocking teeth 56.

Figure 8C:
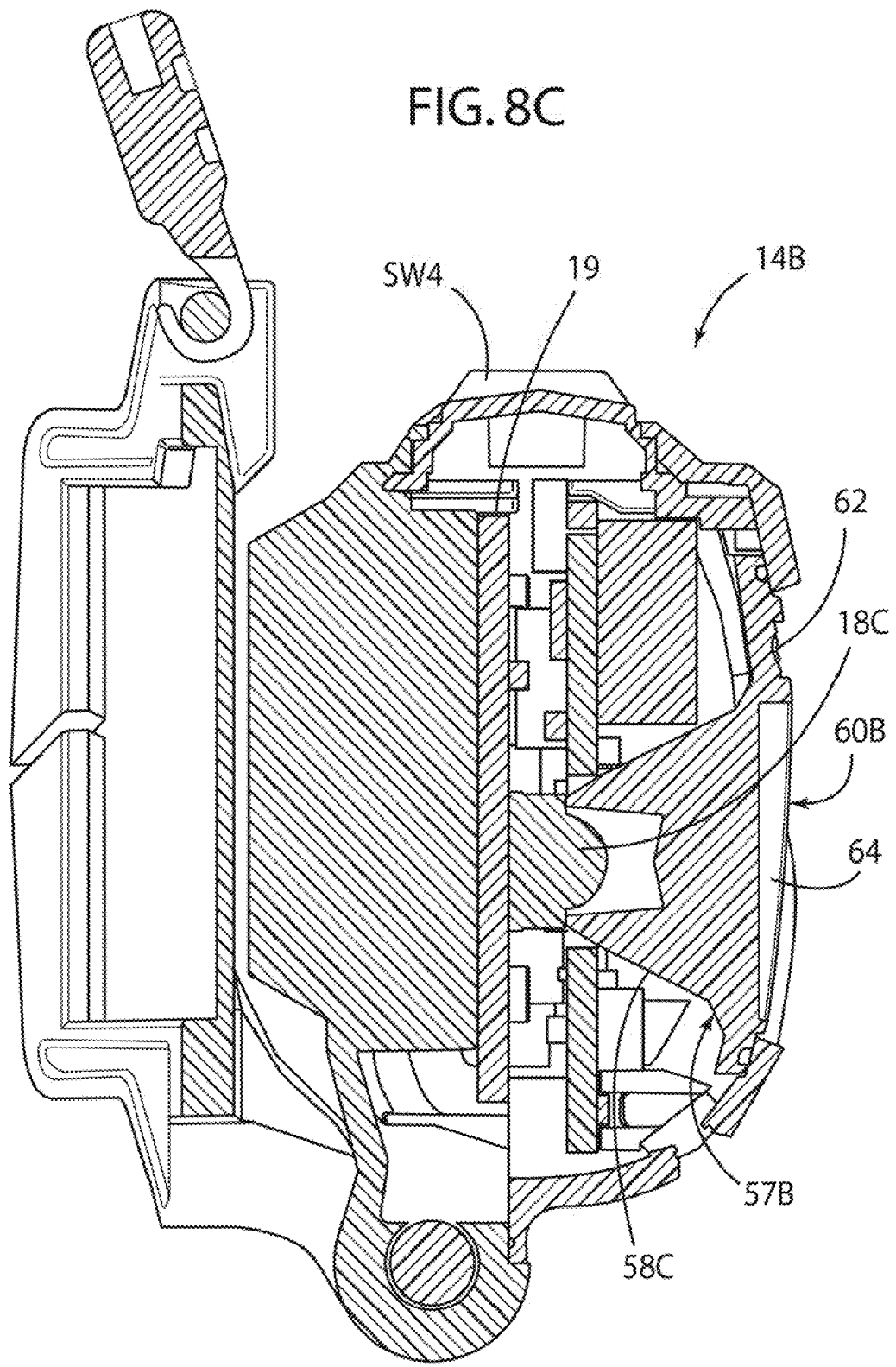
FIG. 8C is a cross-sectional view of the headlight lighting device of the lighting system, in accordance with one embodiment of the present invention.
Figure 8D:
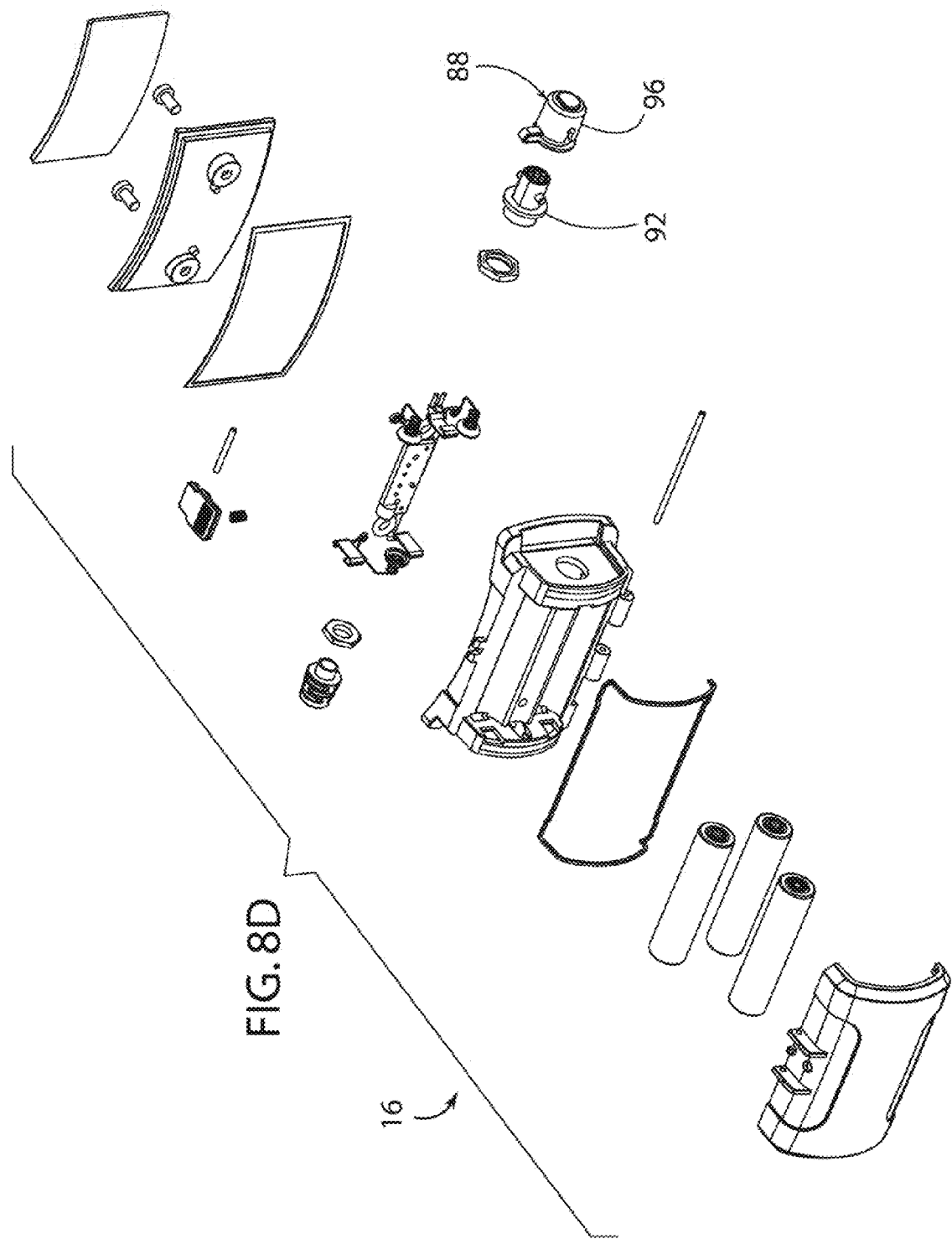
FIG. 8D is an exploded view of an internal power source of the headlight lighting device of the lighting system, in accordance with one embodiment of the present invention.
Figure 9A:
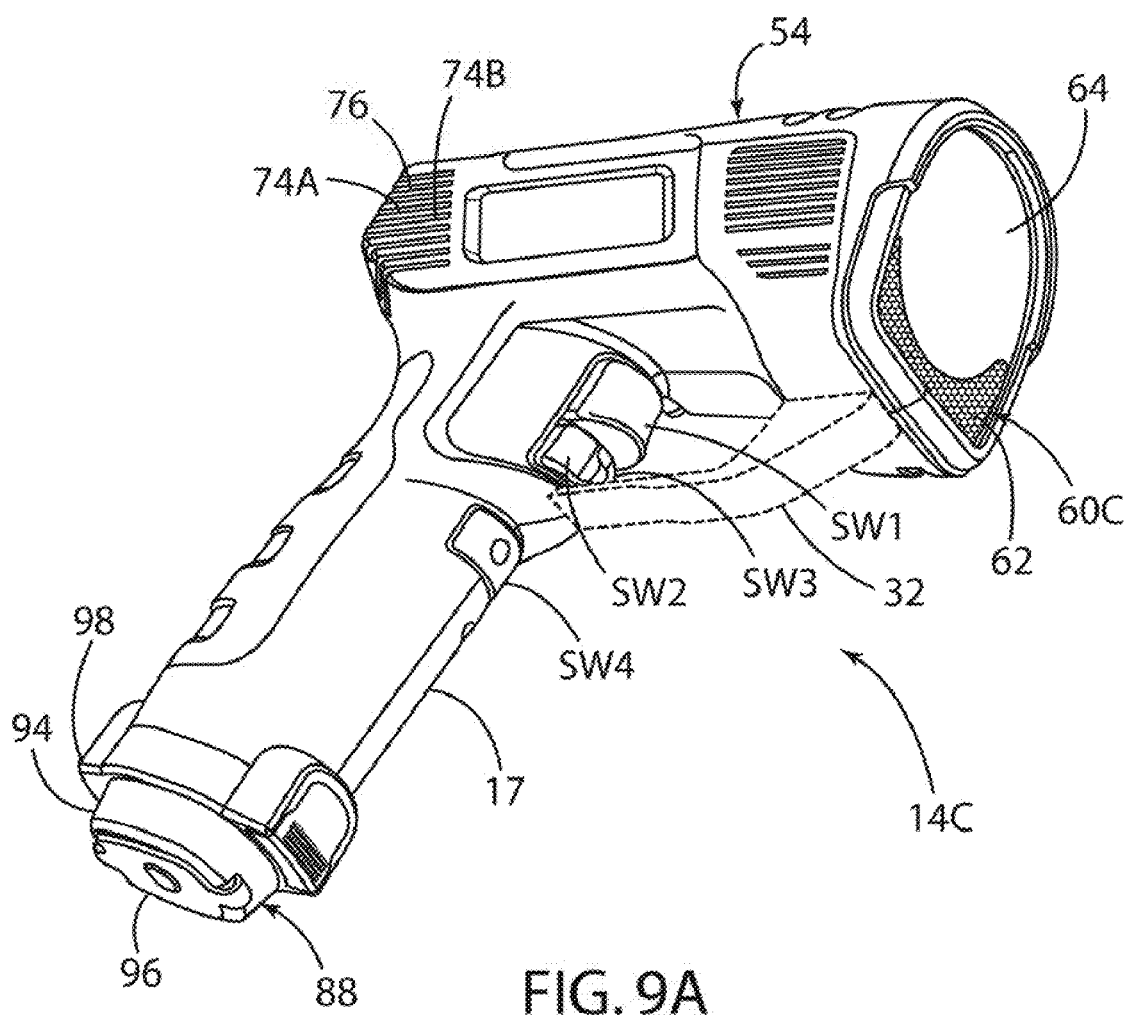
FIG. 9A is a side perspective view of a spotlight lighting device of a lighting system, in accordance with one embodiment of the present invention.
Figure 9B:
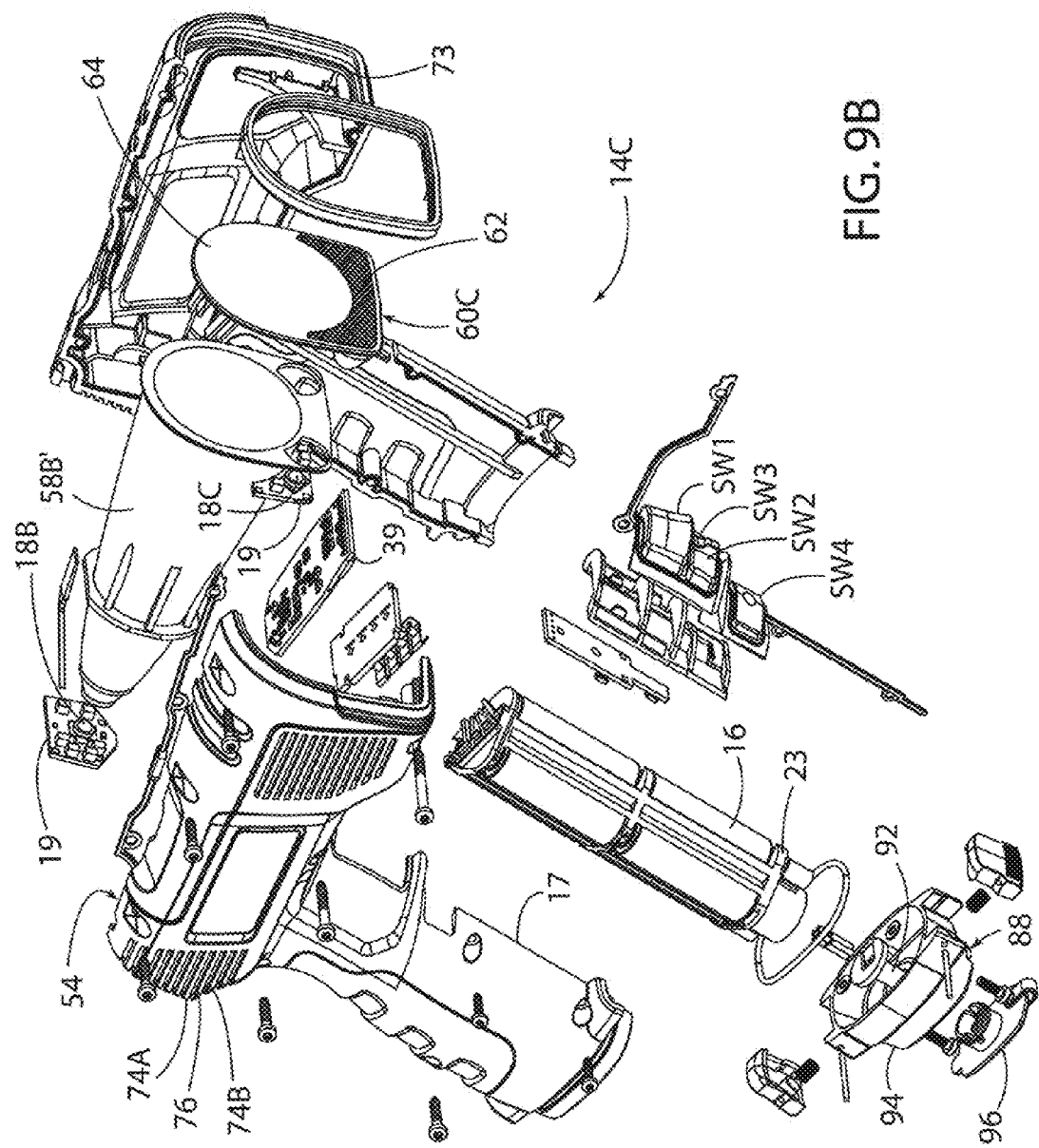
FIG. 9B is an exploded view of the spotlight lighting device of the lighting system, in accordance with one embodiment of the present invention.
Figure 10A:
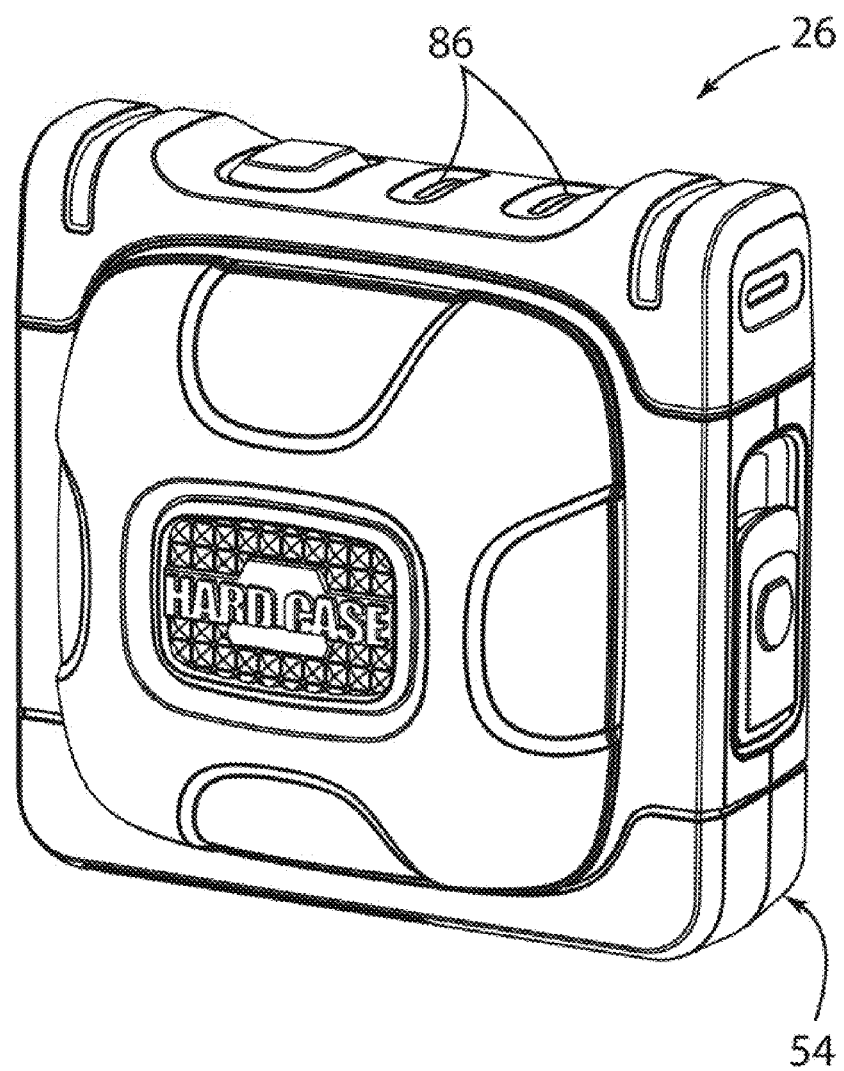
FIG. 10A is a front perspective view of an energy storage system of a lighting system, in accordance with one embodiment of the present invention.
Figure 10B:
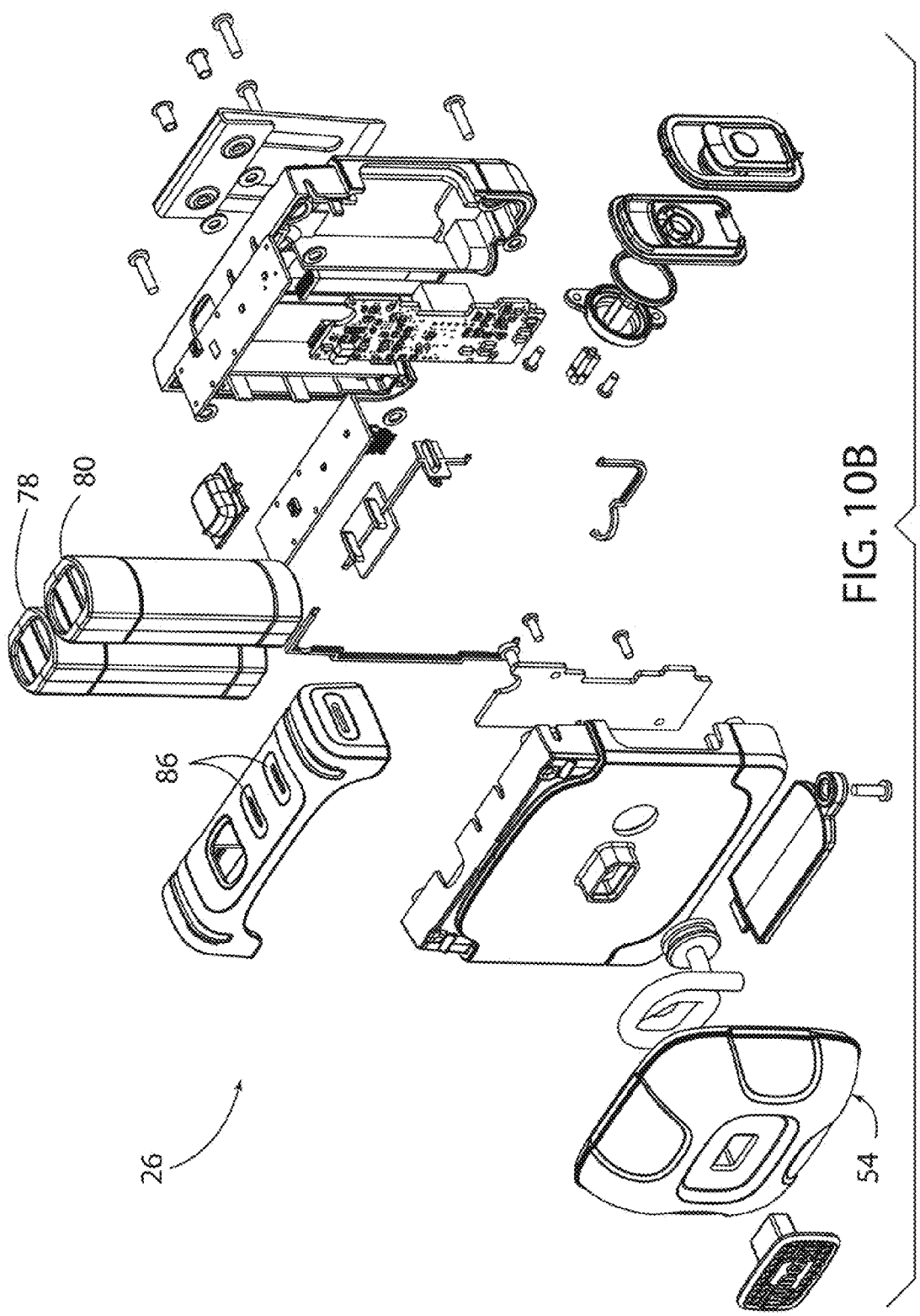
FIG. 10B is an exploded view of the energy storage system of the lighting system, in accordance with one embodiment of the present invention.
Figure 10C:
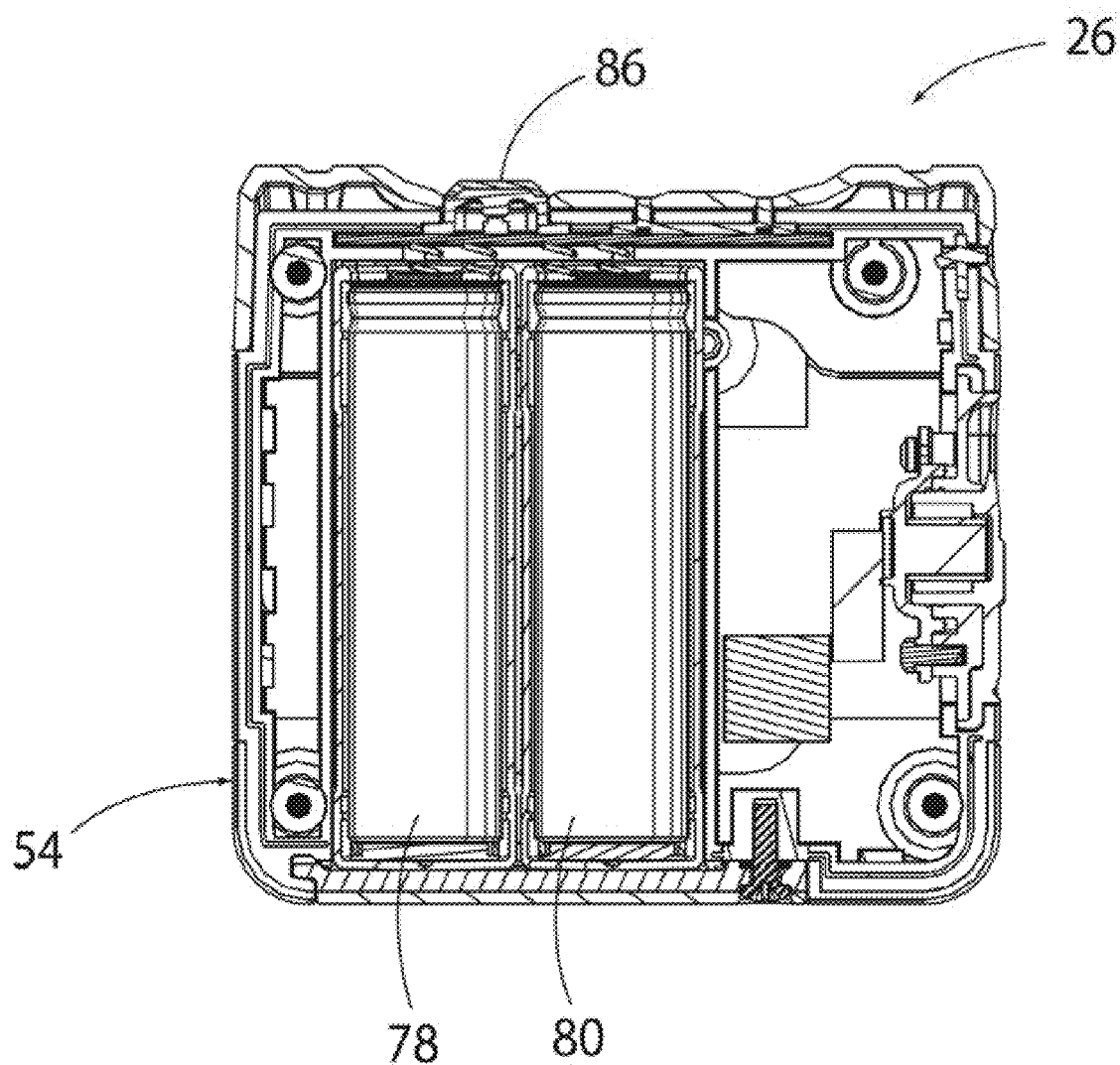
FIG. 10C is a cross-sectional view of the energy storage system of the lighting system, in accordance with one embodiment of the present invention.
Figure 11B:
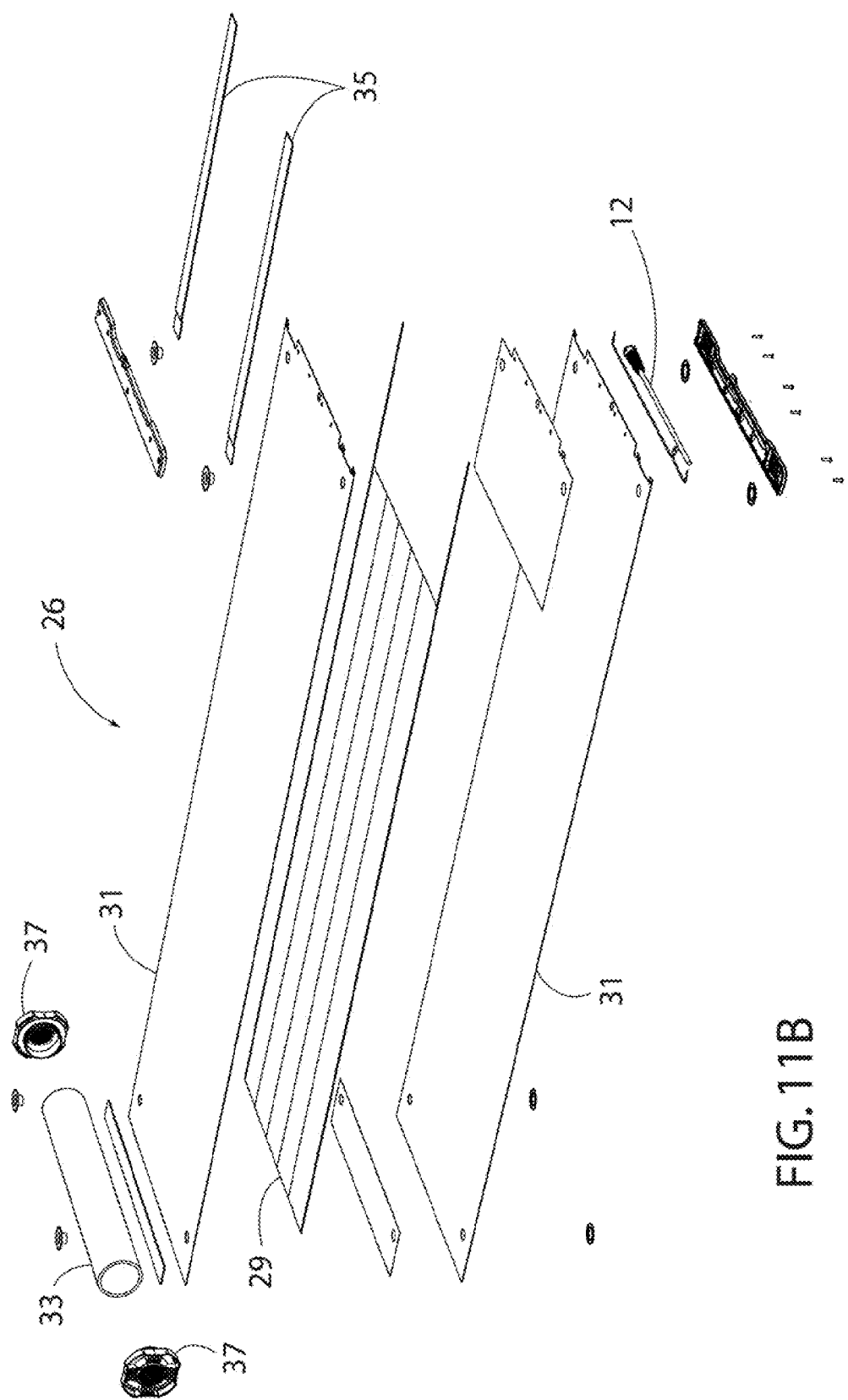
FIG. 11B is an exploded view of the solar power source of the lighting system in a solar radiation harvesting position, in accordance with one embodiment of the present invention.

According to one embodiment, the handheld lighting device 14A has the internal power source 16, which includes three (3) AA size batteries connected in series. Typically, at least two of the AA batteries are positioned side-by-side, such that the three (3) AA size batteries are not each end-to-end, and a circuit board 39 is positioned around the three (3) AA size batteries within the housing 54. According to one embodiment, the internal power source 16 of the headlight lighting device 14B is not housed within the same housing as the light sources 18A,18B,18C, but can be directly electrically connected to the lighting sources 18A,18B,18C and mounted on the headband 21 as the housing 54 enclosing the lighting sources 18A,18B,18C. Thus, the internal power source 16 of the headlight lighting device 14B differs from the external power sources 20,22,24,26,27 that connect to the headlight lighting device 14B with the electrical connector 12. Further, the headlight lighting device 14B can include one or more internal power sources 16 that have batteries enclosed therein. Typically, the internal power source 16 of the headlight lighting device 14B includes three (3) AAA size batteries, as shown in FIG. 8D. Typically, AAA size batteries are used in the headlight lighting device 14B in order to reduce the weight of the headlight lighting device 14B, which is generally supported by the user's head, when compared to the weight of other size batteries (e.g., AA size batteries, C size batteries, etc.). According to one embodiment, the spotlight lighting device 14C has the internal power source 16, which includes six (6) AA size batteries, each supplying about 1.5 Volts, and electrically coupled in series to provide a total voltage potential of about nine Volts (9V). Typically, the six (6) AA size batteries are placed in a clip device 23 and inserted into the handle 17 of the housing 54 of the spotlight lighting device 14C, as shown in FIG. 9B. However, it should be appreciated by those skilled in the art that batteries of other shapes, sizes, and voltage potentials can be used as the internal power source 16 of the lighting devices 14A,14B,14C.

In regards to FIGS. 1 and 11A-11C, the solar power source 26 includes a film material 29 having panels, wherein the panels receive radiant solar energy from a solar source, such as the sun. According to one embodiment, the film material 29 includes one (1) to five (5) panels. The film material 29, via the panels, receives or harvests the solar energy, such that the solar energy is converted into an electrical current, and the electrical current is propagated to the lighting device 14A, 14B,14C or the energy storage system 24,27 through the electrical connector 12. According to one embodiment, the solar radiation received by the solar power source 26 is converted into an electrical current having a voltage potential of approximately eight Volts (8V). Further, film material 29 can be a KONARKA™ film material, such as a composite photovoltaic material, in which polymers with nano particles can be mixed together to make a single multi-spectrum layer (fourth generation), according to one embodiment. According to other embodiments, the film material 29 can be a single crystal (first generation) material, an amorphous silicon, a polycrystalline silicon, a microcrystalline, a photo electrochemical cell, a polymer solar cell, a nanocrystal cell, and a dyesensitized solar cell. Additionally, the solar power source 26 can include protective cover films 31 that cover a top and bottom of the film material 29. For purposes of explanation and not limitation, the protective cover film 31 can be any suitable protective cover film, such as a laminate, that allows solar radiation to substantially pass through the protective cover film 31 and be received by the film material 29.

According to one embodiment, the film material 29 and the protective cover film 31 are flexible materials that can be rolled or wound about a mandrel 33. The mandrel 33 can have a hollow center, such that the electrical connector 12 or other components can be stored in the mandrel 33. Straps 35 can be used to secure the film material 29 and the protective cover film 31 to the mandrel when the film material 29 and protective cover film 31 are rolled about the mandrel 33 or in a rolled-up position, according to one embodiment. Additionally, the straps 35 can be used to attach the solar power source 26 to an item, such as, but not limited to, a backpack or the like, when the film material 29 and protective cover film are not rolled about the mandrel 33 or in a solar radiation harvesting position. Additionally or alternatively, end caps 37 can be used to further secure the film material 29 and protective cover film 31 when rolled about the mandrel 33, and to provide access to the hollow interior of the mandrel 33.

According to an alternate embodiment, the film material 29 can be a foldable material, such that the film material 29 can be folded upon itself in order to be stored, such as when the solar power source 26 is in a non-solar radiation harvesting position. Further, the film material 29, when in the folded position, can be stored in the mandrel 33, other suitable storage containers, or the like. Additionally, the protective cover film 31 can be a foldable material, such that both the film material 29 and protective cover film 31 can be folded when in a non-solar radiation harvesting position. The film material 29 and protective cover film 31 can then also be un-folded when the film material 29 is in a solar radiation harvesting position.

With respect to FIGS. 1-5 and 7-12, the electrical connector 12 includes a plurality of pins 41 (FIG. 12) connected to a plurality of electrical wires 43 that extend longitudinally through the electrical connector 12, according to one embodiment. Typically, the plurality of pins 41 are positioned, such that the pins 41 matingly engage to make an electrical connection with a electrical component of the device 14A,14B, 14C,20,22,24,26,27 that is connected to the electrical connector 12. Thus, the electrical wires 43, and the pins 41, can communicate or propagate an electrical current between one of the light devices 14A,14B,14C and one of the external power sources 20,22,24,26, or 27 and between the external power sources (i.e. the AC power source 20 to the energy storage system 24) at different voltage potentials. According to one embodiment, the electrical connector 12 communicates an intelligence signal from the power source 20,22,24, 26,27 to the lighting device 14A,14B,14C, such that the lighting device 14A,14B,14C can confirm that the electrical connector 12 is connecting a suitable external power source to the connected lighting device 14A,14B,14C.

According to one embodiment, the connector 41 includes an outer sleeve 45 having a first diameter and an inner sleeve 47 having a second diameter, wherein the second diameter is smaller than the first diameter. The connector 41 can further include a retainer 49 that surrounds at least a portion of the plurality of pins 41 and the electrical wires 43, according to one embodiment. The retainer 49, in conjunction with other components of the electrical connector 12, such as the outer sleeve 45 and inner sleeve 47, form a water-tight seal, so that a waterproof connection between the pins 41 and the electrical components of the connected device 14A,14B,14C,20,22, 24,26,27.

Additionally or alternatively, the connector 41 includes a quarter-turn sleeve 51, which defines at least one groove 53 that extends at least partially circumferentially, at an angle, around the quarter-turn sleeve 51. According to one embodiment, the electrical connector 12 includes a flexible sleeve 55 at the non-connecting end of the quarter-turn sleeve 51 that connects to a protective sleeve 59. Typically, the protective sleeve 59 extends longitudinally along the length of the electrical connector 12 to protect the wires 43, and the flexible sleeve 55 allows the ends of the electrical connector 12 to be flexible so that the pins 41 can be correctly positioned with respect to a receiving portion of the device 14A,14B,14C,20, 22,24,26, or 27.

The spotlight lighting device 14C can also include a switch guard 32, according to one embodiment. Additionally or alternatively, the devices 14A,14B,14C,20,22,24,26,27 can include the tail cap assembly 88. The tail cap assembly 88 includes a hinge mechanism 90, wherein at least one cover is operably connected to the hinge mechanism 90, such that the at least one cover pivots about the hinge mechanism 90. According to one embodiment, a connector 92 is attached or integrated onto a cover 94, wherein the connector 92 is the corresponding male portion to the electrical connector 12. The connector 92 can include a flange that is positioned to slidably engage the groove 53 of the electrical connector 12 when the connector 92 is being connected and disconnected from the electrical connector 12, according to one embodiment. The connector 92 is electrically connected to the lighting sources 18A,18B,18C when the cover 94 is in a fully closed positioned, such that when one of the external power sources 20,22,24,26, or 27 is connected to one of the lighting devices 14A,14B, or 14C by the electrical connector 12 being connected to the connector 92, the external power source 20,22,24,26,27 propagates an electrical current to the lighting sources 18A,18B,18C. When the cover 94 is in an open position, the connector 92 is not electrically connected to the lighting sources 18A,18B,18C, and the internal power source 16 can be inserted and removed from the lighting device 14A,14B,14C.

According to an alternate embodiment, the tail cap assembly 88 includes a second cover 96 that covers the connector 92 when in a fully closed position. Typically, the second cover 96 is operably connected to the hinge mechanism 90, such that the second cover pivots about the hinge mechanism 90 along with the cover 94. When the second cover 96 is in the fully closed position, the electrical connector 12 cannot be connected to the connector 92, and when the second cover 96 is in an open position, the electrical connector 12 can be connected to the connector 92. Thus, the connector 92 does not have to be exposed to the environment that the lighting device 14A,14B,14C is being operated in, when the connector 92 is not connected to the electrical connector 12. Further, the tail cap assembly 88 can include a fastening mechanism 98 for securing the cover 94,96 when the cover 94,96 is in the fully closed position.

The energy storage system 24 and the solar power energy storage system 27 include a plurality of battery cells including at least a first battery cell 78 and a second battery cell 80, according to one embodiment. The exemplary embodiments described herein are generally discussed with respect to the first and second battery cells 78,80; however, it should be appreciated by those skilled in the art that any suitable number of battery cells can be used in the energy storage system 24 or the solar power energy storage system 27, such as, but not limited to, three (3) or four (4) battery cells used in the energy storage system 24 or the solar power energy storage system 27. According to one embodiment, the power source 20,22,26,27 supplies an electrical current to the energy storage system 24 having a voltage potential of approximately eight Volts (8V) to twelve Volts (12V).

II. Electrochemistry Detection

With respect to FIGS. 1-5, 7-11, and 13-21, the internal power source 16 and external power sources, such as the AC power source 20, the DC power source 22, the energy storage system 24, the solar power source 26, and the solar power energy storage system 27, can have a variety of electrochemical compositions, wherein the electrochemical composition can be determined in order to control one or more features of the lighting device 14A,14B,14C, according to one embodiment. Typically, the lighting device 14A,14B,14C has a load that is in electrical communication with the power source, such as the white flood LED 18A, white spot LED 18B, and red flood LED 18C, being in electrical communication with one of the internal power source 16, the AC power source 20, the DC power source 22, the energy storage system 24, the solar power source 26, and the solar power energy system 27. An electrochemical composition device, such as the processor 36, can then determine the electrochemical composition of certain power sources, such as the internal power source 16, the energy storage system 24, and the solar power energy storage system 27, according to one embodiment.

According to one embodiment, the electrochemical composition device can be a stand-alone unit or combined with another unit, device, or system, such as, but not limited to, the lighting device 14A,14B,14C, a battery recharging device, a cell phone, a personal digital assistance (PDA), a multimedia player, or the like.

The lighting device 14A,14B,14C may be powered by one of a number of different types of electrochemical cell batteries. For example, a single AA-size alkaline electrochemical cell battery having an electrochemistry that includes an alkaline electrolyte and electrodes generally made up of zinc and manganese dioxide ($Zn/MnO_2$) as the active electrochemical materials, according to one embodiment may be employed. According to another embodiment, a lithium AA-size $LiFeS_2$ electrochemical cell may be employed as the power source. According to further embodiments, a nickel metal hydride (NiMH) electrochemical cell, a lithium electrochemical cell, a lithium ion electrochemical cell, and a lead acid electrochemical cell may be employed as the power source. Different types of batteries cells employing different chemical compositions provide different power capabilities. It should be appreciated by those skilled in the art that additional or alternative electrochemical compositions of power sources can be determined.

The processor 36 can determine the electrochemical composition of the power source 16,24,27 by executing one or more software routines and/or by receiving data to determine a voltage potential of the power source 16,24,27 under at least one operating condition of the lighting device 14A,14B,14C with respect to the load. The processor 36 can then determine an electrical current supplied by the power source 16,24,27 to the load, and detect the electrochemical composition of the power source 16,24,27 based upon the determined voltage potential under the operating condition and the determined electrical current.

According to one embodiment, the processor 36 determines an open circuit voltage ($V_{oc}$) and a closed circuit voltage ($V_{oc}$) under known load conditions. The open circuit voltage ($V_{oc}$) and the closed circuit voltage ($V_{oc}$) can be subtracted and divided by the determined electrical current provided to the load in order to determine the internal resistance ($R_{Internal}$) of the power source 16,24,27. Based upon the internal resistance ($R_{Internal}$) of the power source 16,24,27, the electrochemical composition of the power source 16,24,27 can then be determined. Thus, the internal resistance ($R_{Internal}$) of the power source 16,24,27 can be represented by the following equation:

$$\frac{(V_{oc} - V_{cc})}{I} = R_{Internal}$$

According to another embodiment, the processor 36 determines the internal resistance ($R_{INTERNAL}$) of the power source 16,24,27 based on the open circuit voltage, closed circuit voltage, and the known load resistance $R_{LOAD}$, as set forth in the following equation:

$$R_{INTERNAL} = \frac{(V_{oc} - V_{cc}) \times R_{LOAD}}{V_{cc}}$$

In this embodiment, the electrical current need not be determined by the processor 36. Instead, the internal resistance of the power source 16,24,27 is determined by the difference between the open circuit voltage ($V_{oc}$) and the closed circuit voltage ($V_{cc}$) multiplied by the known load resistance ($R_{LOAD}$) divided by the closed circuit voltage ($V_{cc}$). It should be appreciated that the above determinations of internal resistance generally apply to determining the internal resistance of a single cell battery. However, it should be appreciated that the internal resistance of multiple cells, such as two battery cells, may be determined. It should be appreciated that other suitable determinations for the internal resistance can be employed, according to other embodiments.

The processor 36 can then use the internal resistance ($R_{Internal}$), the magnitude of the voltage (e.g., the open circuit voltage ($V_{oc}$) and the closed circuit voltage ($V_{cc}$)), temperature data (e.g., data received from the temperature monitoring device 50), stored hierarchical correction data, a lookup table of known internal resistance ($R_{Internal}$) values for different electrochemical compositions, or a combination thereof, to determine the electrochemical composition of the power source 16,24,27. Typically, the lookup table data is stored in a memory device. Additionally, the determined open circuit voltage ($V_{oc}$) can be used as a cross-reference with the internal resistance ($R_{Internal}$) of the processor 36 to determine the electrochemical compositions of the power source 16,24,27. The controller 36 can then control one or more operating parameters of the lighting device 14A,14B,14C based upon the determined electrochemical composition of the power source 16,24,27.

By way of explanation and not limitation, the determined electrochemical composition of the power source 16,24,27 can be used to determine the state of charge of the power source 16,24,27, as described in greater detail herein. Additionally or alternatively, the determined electrochemical composition of the power source 16,24,27 can be used to alter the electrical current supplied to the lighting sources 18A, 18B,18C in conjunction with the temperature data received by the processor 36 from the temperature monitoring device 50. Thus, the heat emitted by the lighting sources 18A,18B, 18C can be monitored by the temperature monitoring device 50, and the electrical current supplied to the lighting sources 18A,18B,18C can be controlled according to a desired lighting device 14A,14B,14C operating temperature with respect to the electrochemical composition of the internal power source 16.

According to one embodiment, the processor 36 determines the electrochemical composition of the power source 16,24,27 at predetermined time intervals, such as, but not limited to, detecting the electrochemical composition every five minutes (5 min). By detecting the electrochemical composition of the power source 16,24,27 at predetermined time intervals, the power consumption of the processor 36 and processing load of the processor 36 for the electrochemical composition determination is limited when compared to continuously determining the electrochemical composition of the power source 16,24,27. Further, by determining the electrochemical composition of the power source 16,24,27 at predetermined time intervals, the processor 36 can confirm or correct the previous electrochemical composition determination and/or determine the electrochemical composition of the newly connected power source 16,24,27.

According to one embodiment, a method of determining the electrochemical composition of the power source 16,24, 27 is generally shown in FIG. 13 at reference identifier 1160. The method 1160 starts at step 1162, and proceeds to step 1164, wherein an open circuit voltage is determined. At step 1166, a closed circuit voltage is determined. Typically, the closed circuit voltage can be determined with respect to a known load. At step 1167, an operating electrical current is determined. According to one embodiment, the operating electrical current is determined by measuring the operating current. The method 1160 then proceeds to step 1168, wherein the internal resistance ($R_{Internal}$) of a source is determined based upon the open circuit voltage, the closed circuit voltage, and the operating electrical current. At step 1170, the electrochemical composition of the source (e.g., power source 16,24,27) is determined based upon the internal resistance ($R_{Internal}$) and the open circuit voltage, and the method 1160 then ends at step 1172.

Figure 14:
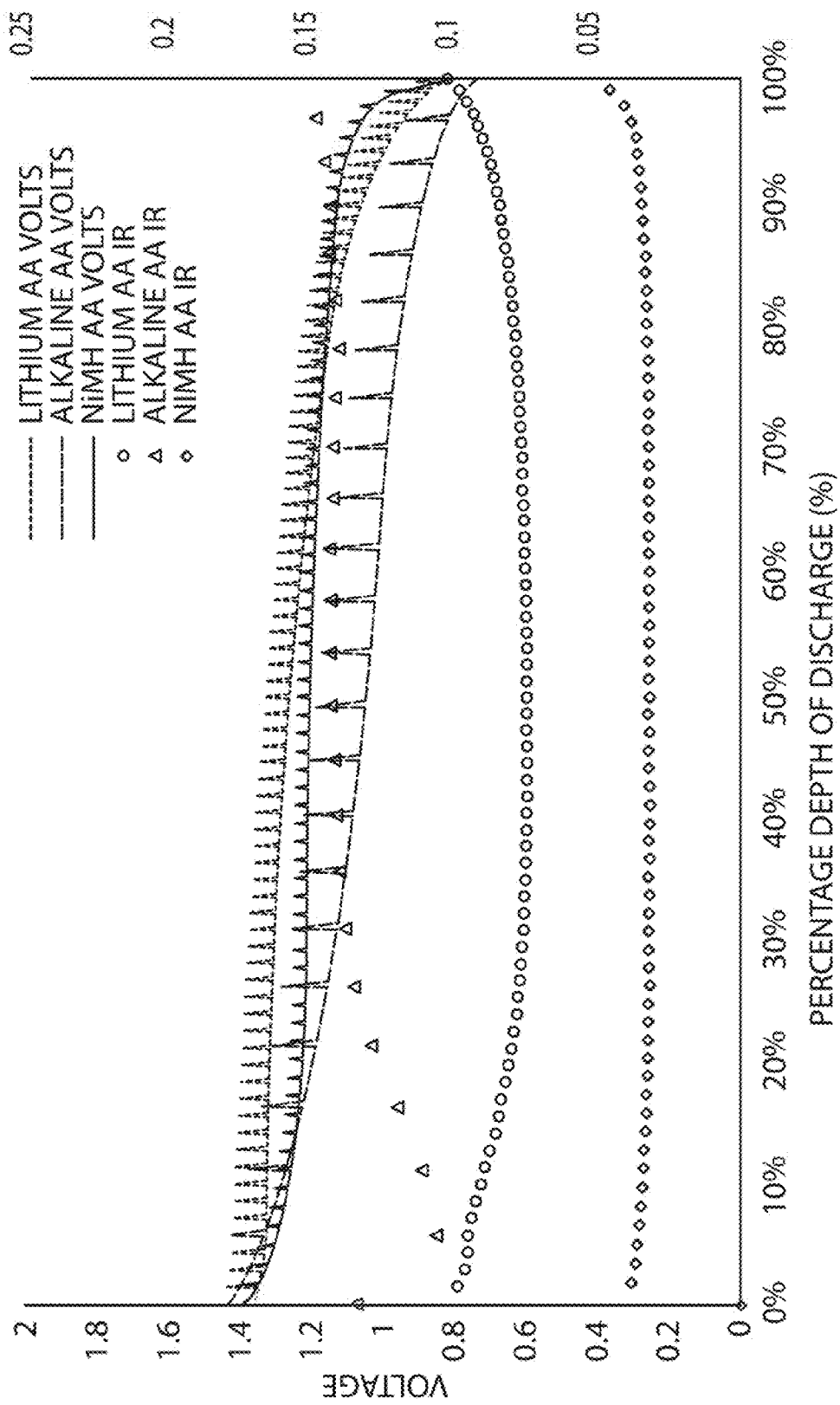
FIG. 14 is a chart illustrating a state of charge with respect to a voltage potential and an internal resistance of a battery cell with different electrochemical compositions, in accordance with one embodiment of the present invention.

As illustrated in FIG. 14, the percentage depth of discharge, a voltage potential, and the internal resistance ($R_{Internal}$) of a power source differs based upon the electrochemistry composition of the power source. Typically, the voltage potential of the power source changes based upon the percent depth of discharge at one rate of change, and the internal resistance ($R_{Internal}$) of the power source alters based upon the percent of discharge at a second rate of change. Thus, by comparing the voltage potential and the internal resistance ($R_{Internal}$) when the electrochemistry composition of the power source is determined, the percent depth of discharge can then be determined.

Figure 17:
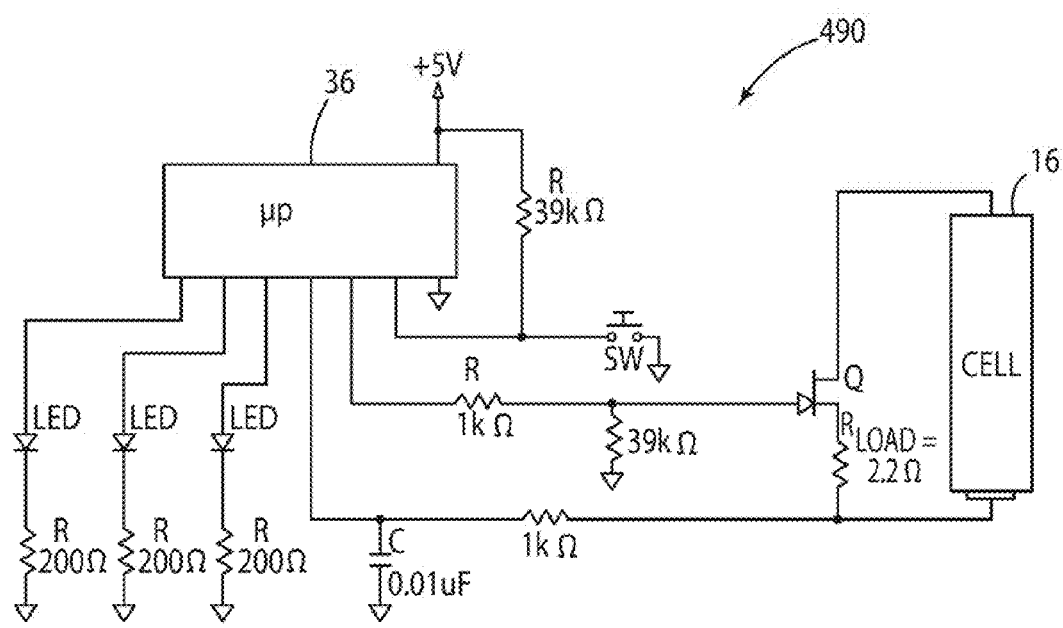
FIG. 17 is a circuit diagram generally illustrating test circuitry for detecting the electrochemical composition of a power source of a device or system of a lighting system, in accordance with one embodiment of the present invention.

Referring to FIG. 17, electrochemistry composition test circuitry 490 is illustrated for detecting chemistry composition of a power source 16,24,27, according to one embodiment. By way of explanation and not limitation, the power source or cell illustrated in FIG. 17 is internal power 16. It should be appreciated that the test circuitry 490 may be built into the lighting device 14A,14B,14C and may be included as part of the control circuitry. Alternately, the test circuitry 490 may be a separate circuit. Test circuitry 490 can employ hardware circuitry that is adapted to electrically connect to the power source 16,24,27, and the processor 36 powered by a voltage supply of five volts (+5V), according to one example. It should be appreciated that a voltage boost circuit may be employed to boost a voltage of the power source 16,24,27 to five Volts (5V) to power the processor 36. It should further be appreciated that the test circuitry 490 can include a separate processor. The test circuitry includes a known load resistance $R_{LOAD}$ connectable via a switch, shown as a field effect transistor (FET) Q, in parallel with the power source 16,24,27. According to one embodiment, the load resistance $R_{LOAD}$ has a known value of 2.2 ohms. Connected in series with the load resistance $R_{LOAD}$ is the transistor Q for switching the load resistance $R_{LOAD}$ in or out of a closed circuit with the power source 16,24,27. Switch Q may be implemented as an FET transistor controlled by an output of the processor 36. Transistor Q may be controlled by the processor 36 to apply the load resistance $R_{LOAD}$ across the power source 16,24,27 to allow for measurement of the closed circuit voltage and current, and may be opened to allow for measurement of the open circuit voltage of the power source 16,24,27. Voltage measurements may be taken from the positive (+) terminal of power source 16,24,27 by an RC circuit coupled to the processor 36.

It should be appreciated that according to the illustrated test circuit 490, a switch SW may be actuated by depression to initiate the chemistry composition test, according to one embodiment. However, it should be appreciated that the test circuitry 490 may be implemented automatically by the processor 36 based on time intervals, or other triggering events such as activating one or more light sources or changing (replacing) one or more batteries. Further, three LEDs are shown connected to the processor 36, The three LEDs may include light sources of the lighting device, or may include additional lighting indicators that may be used to indicate the determined type of power source 16,24,27 electrochemical composition. For example, a first LED may be employed to indicate detection of a lithium battery cell, a second LED may be employed to indicate detection of a nickel metal hydride battery cell, and a third LED may be used to indicate detection of an alkaline battery cell.

Figure 18:
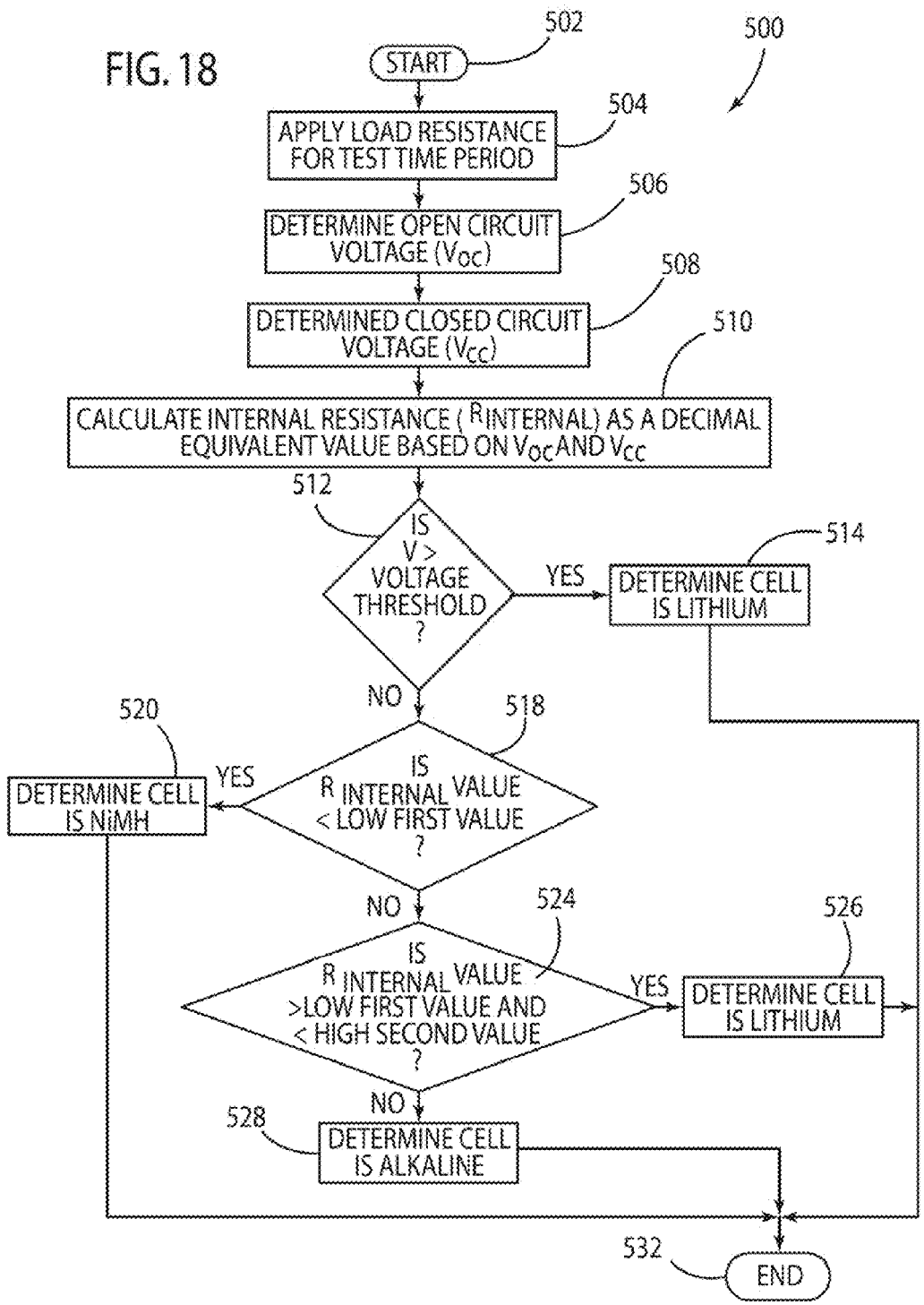
FIG. 18 is a flow chart illustrating a routine for determining the electrochemical composition of a power source of a device or system of a lighting system, in accordance with another embodiment of the present invention.

Referring to FIG. 18, a method of determining the electrochemical composition of a power source 16,24,27 is generally illustrated at reference identifier 500, according to another embodiment. The method 500 starts at step 502, and proceeds to step 504 to apply a load resistance $R_{LOAD}$ to the power source 16,24,27 for a test time period, according to one example. In one exemplary embodiment, the load resistance $R_{LOAD}$ is about 2.2 ohms, and the test time period is approximately 100 milliseconds. During the chemistry detection test, method 500 determines an open circuit voltage $V_{oc}$ in step 506 and a closed circuit voltage $V_{cc}$ in step 508. The open circuit voltage $V_{oc}$ is determined with the load not applied to the power source 16,24,27, such that the battery circuit is open-circuited and no current flows in or out of the power source 16,24,27, whereas the closed circuit voltage $V_{cc}$ is determined when the known load resistance $R_{LOAD}$ is applied across the power source 16,24,27 terminals, such that current flows across the load resistance $R_{LOAD}$. The method 500 then proceeds to step 510, wherein the internal resistance ($R_{INTERNAL}$) of the power source 16,24,27 is determined based upon the open circuit voltage $V_{oc}$ and closed circuit voltage $V_{cc}$. According to one embodiment, current may also be used to determine the internal resistance of the power source 16,24,27. The internal resistance value is determined as a decimal equivalent value, according to the disclosed embodiment, which is determined based on a multiplication factor, such as $1/1000^{th}$ of the actual resistance. It should be appreciated that the internal resistance may be determined as an actual ohmic value, according to another embodiment.

The battery chemistry detection method 500 then proceeds to decision step 512 to compare the open circuit voltage $V_{oc}$ to a voltage threshold. According to one embodiment, the voltage threshold can be about 1.65 Volts. If the open circuit voltage $V_{oc}$ is greater than the voltage threshold of 1.65 Volts, method 500 determines that the power source 16,24,27 is a lithium cell in step 514.

If the open circuit voltage $V_{oc}$ is not greater than the voltage threshold (e.g., 1.65 Volts), method 500 proceeds to decision step 518 to determine if the internal resistance value is less than a low first value. According to one embodiment, the low first value is 89. If the internal resistance value is less than the low first value (e.g., 89), method 500 determines that the battery cell is a nickel metal hydride (NiMH) in step 520.

If the internal resistance $R_{INTERNAL}$ value is equal to or greater than the low first value of 89, method 500 proceeds to decision step 524 to determine if the internal resistance $R_{INTERNAL}$ value is in a range between the low first value (e.g., 89) and a high second value. According to one embodiment, the high second value is 150. If the internal resistance value is between the low first value (e.g., 89) and the high second value (e.g., 150), method 500 determines that the power source 16,24,27 is a lithium cell in step 526. It should be appreciated that the power source 16,24,27 may be determined to be a lithium battery cell which has a voltage less than or equal to the voltage threshold (e.g., 1.65 Volts) and has an internal resistance value between the low first value (e.g., 89) and the high second value (e.g., 150) when the lithium battery cell has been partially discharged, as opposed to a fully charged lithium battery cell. Additionally or alternatively, if the voltage of a cell is above approximately four volts (4V), then it can be determined that the cell has a lithium-ion electrochemical composition, and if the voltage of the cell is above approximately two volts (2V), then it can be determined that the cell has a lead acid electrochemical composition.

If the internal resistance $R_{INTERNAL}$ value is greater than or equal to the high second value (e.g., 150) in decision step 524, method 500 proceeds to step 528 to determine that the power source 16,24,27 is an alkaline battery cell. It should be appreciated that method 500 may be repeated at select intervals or based on any of the number of triggering events, such as replacement of the batteries, actuation of a light source, and other events.

Figure 19:
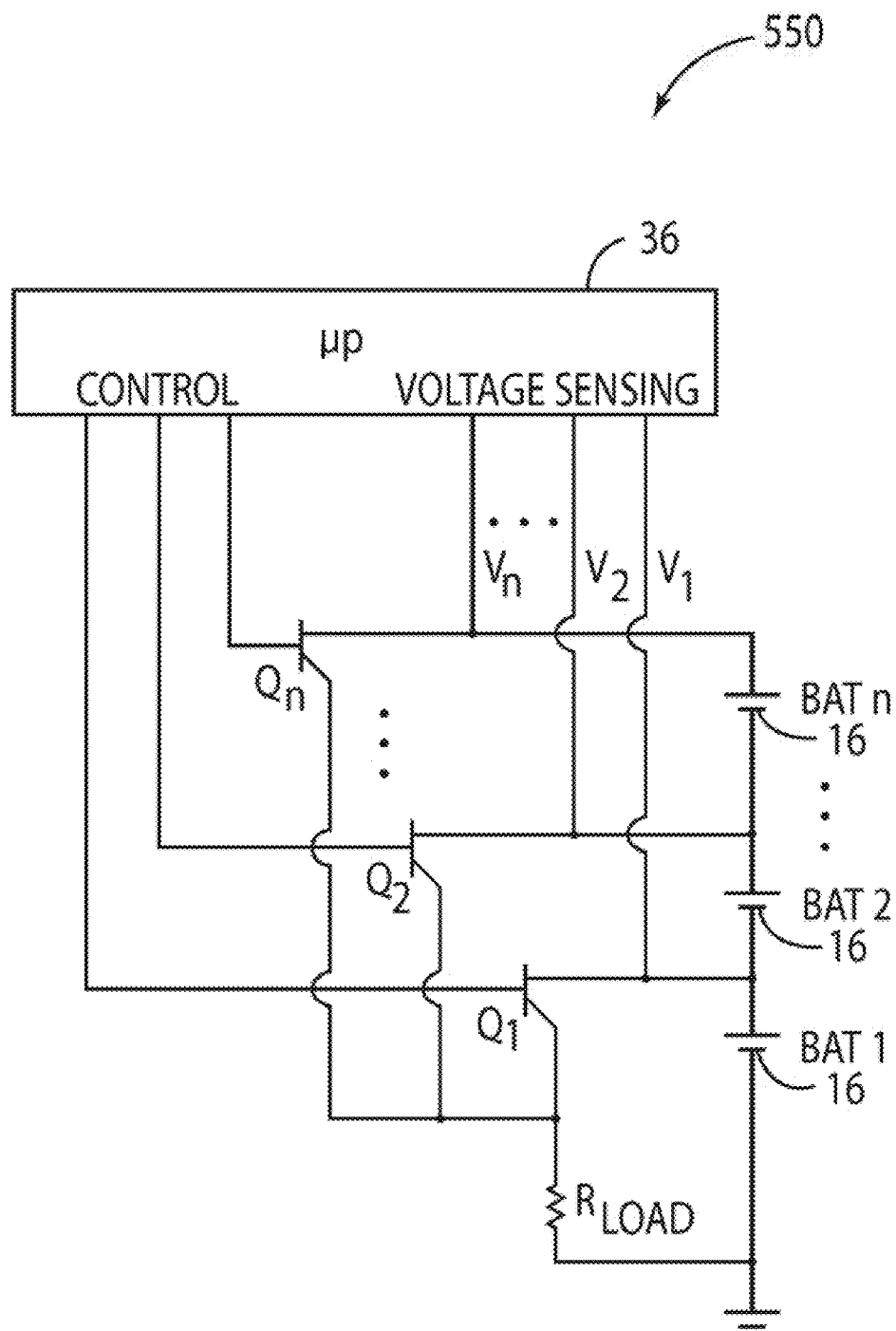
FIG. 19 is a circuit diagram generally illustrating test circuitry for detecting the electrochemical composition of multiple battery cells, in accordance with one embodiment of the present invention.

It should further be appreciated that the internal resistance value and chemistry composition of multiple cells (e.g., power source 16,24,27 includes multiple cells) employed in the lighting device 10 may be determined, according to further embodiments. At least a portion of the multiple cells can have the same electrochemical composition, a different electrochemical composition, or a combination thereof. In one embodiment, multiple battery cells connected in series may be tested to determine the internal resistance $R_{INTERNAL}$ of each battery cell and the electrochemical composition of each battery cell, as shown by the circuit 550 in FIG. 19. In this embodiment, a plurality of battery cells, labeled BAT 1-BAT n are shown connected in series, such that the positive terminal of one battery electrically contacts the negative terminal of an adjoining connected battery. Each battery cell generates a voltage potential and, in a series connection, the voltage potentials are summed together. The chemistry detection circuit 550 is shown including the processor 36 having a plurality of voltage sensing lines for sensing voltages $V_1$-$V_n$, which measure the voltage potential at the positive terminals of each of the plurality of batteries BAT 1-BAT n, respectively. The sensed voltage of BAT 1 is voltage $V_1$, the sensed voltage of BAT 2 is the difference between voltages $V_2$ and $V_1$, etc. By way of explanation and not limitation, BAT 1-BAT n are illustrated in FIG. 19 as internal power source 16.

The battery chemistry detection circuit 550 includes three switches, shown as FET transistors $Q_1$-$Q_n$, each having a control line for receiving a control signal from processor 36. Transistor $Q_1$ switches the known load resistance $R_{LOAD}$ into a closed circuit connection with the first battery BAT 1 in response to a control signal from the processor 36. Transistor $Q_2$ switches the load resistance $R_{LOAD}$ into a closed circuit connection with batteries BAT 1 and BAT 2. Transistor $Q_n$ switches the load resistance $R_{LOAD}$ into connection with batteries BAT 1-BAT n.

When transistor $Q_1$ is closed, the load resistance $R_{LOAD}$ is applied across the first battery BAT 1, such that current flows through the first battery BAT 1 and the load resistance $R_{LOAD}$. During a test procedure, the open circuit voltage for voltage potential $V_1$ is measured when the load resistance $R_{LOAD}$ is not applied across the battery BAT 1, and the closed circuit voltage $V_{cc}$ is measured while the load resistance $R_{LOAD}$ is applied across battery BAT 1. When transistor $Q_2$ is closed, the open and closed circuit voltages of the voltage potentials $V_1$ and $V_2$ are measured during the test procedure. Similarly, when transistor $Q_n$ is closed, the open and closed circuit voltages of voltage potentials $V_1$-$V_n$ are measured during the test procedure.

It should be appreciated that the open circuit voltage of the first battery BAT 1 is determined by sensing voltage $V_1$, whereas the open circuit voltage of the second battery BAT 2 is determined by subtracting the voltage $V_1$ from voltage $V_2$, and the open circuit voltage of BAT n is determined by subtracting voltage $V_{n-1}$ from voltage $V_n$. The closed circuit voltages are also similarly measured. The internal resistance of each battery may be determined according to the following equations:

$$R_{INTERNAL1} = \frac{V_{oc1} - V_{cc1}}{V_{cc1}} \cdot R_{LOAD}; \text{ and}$$

$$R_{INTERNAL1} + R_{INTERNAL2} = \frac{V_{oc2+1} - V_{cc2+1}}{V_{cc2+1}} \cdot R_{LOAD}.$$

$V_{oc1}$ represents the open circuit voltage of battery BAT 1, and $V_{cc1}$ represents the closed circuit voltage of battery BAT 1. $V_{oc2}$ represents the open circuit voltage of battery BAT 2, and $V_{cc2}$ represents the closed circuit voltage of battery BAT 2. The internal resistance $R_{INTERNAL1}$ is the internal resistance of the first battery BAT 1. The internal resistance $R_{INTERNAL2}$ is the internal resistance of the second battery BAT 2. It should be appreciated that the internal resistance of further batteries up to BAT n may likewise be determined.

It should further be appreciated that the battery chemistry detection circuit 550 may detect different types of batteries, such as alkaline, nickel metal hydride and lithium battery cells used in various combinations. While one example of a battery chemistry detection circuit 550 has been illustrated for detecting chemistry of a plurality of battery cells in a series connection, it should be appreciated that other configurations of circuit 550 may be employed to detect other arrangements of batteries, such as a plurality of batteries connected in parallel and/or series, in various battery cell numbers and combinations.

Figure 21:
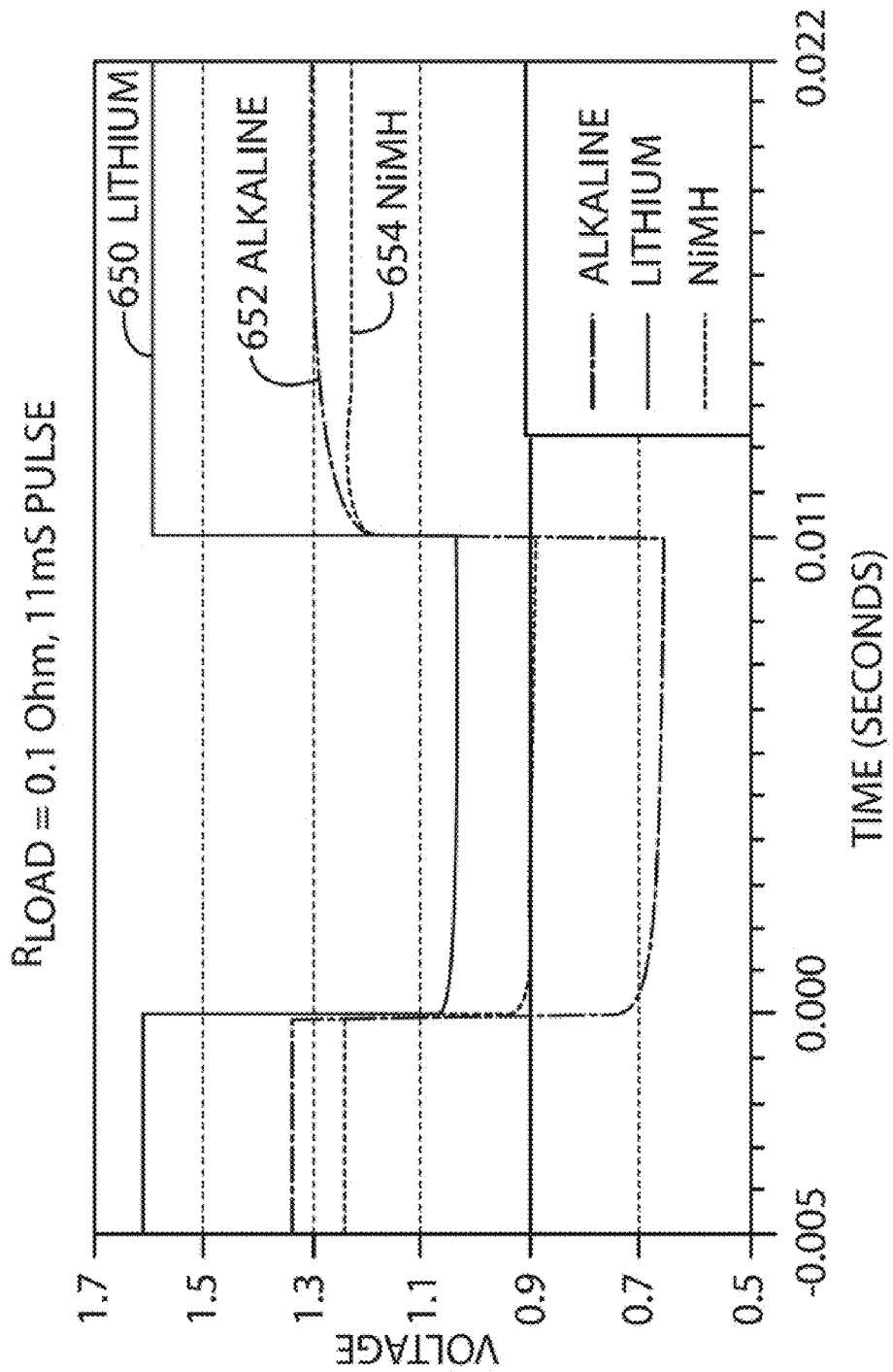
FIG. 21 is a graph illustrating changes in voltage realized for three battery types during the detection test, according to one example.

Referring to FIGS. 20A, 20B, and 21, a method of determining the electrochemical composition of a power source 16,24,27 is generally illustrated in FIGS. 20A and 20B at reference identifier 600, according to another embodiment. In this embodiment, the method 600 determines a recovery time period for the power source 16,24,27 under test to return to a predetermined percentage of its voltage, and further determines the electrochemical composition of the power source 16,24,27 based on the determined recovery time. It should also be appreciated that method 600 determines the electrochemical composition of the power source 16,24,27 as a function of the determined recovery time, in combination with one or more of the internal resistance, the open circuit voltage ($V_{oc}$), and the closed circuit voltage ($V_{cc}$).

With particular reference to FIG. 21, the output voltages of three different batteries having different electrochemical compositions (e.g., the power sources 16,24,27 having different electrochemical compositions, battery cells within the power sources 16,24,27 having different electrochemical compositions, or a combination thereof) are illustrated during a test procedure to detect battery chemistry. Included in the test is a lithium battery cell having a voltage shown by line 650, an alkaline battery cell having a voltage shown by line 652 and a nickel metal hydride battery cell having a voltage shown by line 654. Each of the batteries were subjected to a load resistance $R_{LOAD}$ of about 0.1 ohms for a time period of about 11 milliseconds. Prior to application of the load, the battery cells each had a substantially constant voltage, and during application of the load resistance, the output voltage drops significantly as shown during the time period from 0.000 to 0.011 seconds. At time period 0.011 seconds, the load resistance is no longer applied and the voltage of each of the battery cells recovers over a period of time. The period of time that it takes each battery cell to recover to percentage threshold of 98.5 percent of the voltage prior to applying the load is referred herein as the recovery time. It should be appreciated that in the example shown, a battery cell that recovers to 98.5 percent of the preload voltage in less than 1 millisecond is determined to be a nickel metal hydride battery, whereas the lithium and alkaline battery cells have a longer recovery time, according to the present embodiment of the chemistry detection test process.

Returning to FIGS. 20A and 20B, method 600 starts at step 602, and proceeds to step 604 to apply a known load resistance $R_{LOAD}$ to the battery cell for a test period. According to one example, the known load resistance $R_{LOAD}$ can be about 0.1 ohms, and the test period can be about 11 milliseconds. It should be appreciated that the test period may include other time periods, and that the load resistance $R_{LOAD}$ may have other values. During the chemistry detection test, method 600 determines an open circuit voltage $V_{oc}$ in step 606 and a closed circuit voltage $V_{cc}$ in step 608. The open circuit voltage $V_{oc}$ is determined with the load resistance not applied to the battery cell such that the battery circuit is open-circuited and no current flows in or out of the battery cell, whereas the closed circuit voltage-$V_{oc}$ is determined when the known load resistance $R_{LOAD}$ is applied across the battery cell terminals such that current flows across load resistance $R_{LOAD}$. The method 600 then proceeds to step 610, wherein the internal resistance $R_{INTERNAL}$ of the battery cell is determined based upon the open circuit voltage $V_{oc}$ and closed circuit voltage $V_{cc}$. According to one embodiment, the internal resistance $R_{INTERNAL}$ can be determined as the difference between the open circuit voltage $V_{oc}$ and the closed circuit voltage $V_{cc}$ multiplied by the resistance load $R_{LOAD}$ multiplied by a multiplication factor of 1000 and divided by the closed circuit voltage $V_{cc}$, as shown in the following equation:

$$R_{INTERNAL} = \frac{((V_{oc} - V_{cc}) \times R_{LOAD}) \times 1000}{V_{cc}}$$

The internal resistance value $R_{INTERNAL}$ may be determined as a decimal equivalent value, based on a multiplication factor such as 1000, or may include the actual ohmic value of resistance.

Routine 600 then proceeds to step 612 to determine the recovery time of the battery to reach a percent of the output voltage prior to application of the load. According to one embodiment, the battery reaches 98.5 percent of the output voltage prior to application of the load when determining the recovery time. The recovery time is monitored from the time that the load resistance $R_{LOAD}$ is no longer applied to the battery until the voltage of the battery rises to about 98.5 percent of the voltage prior to applying the load. While a recovery time based on 98.5 percent is disclosed according to the present embodiment, it should be appreciated that the recovery time may be based on other percentage values or voltage levels. The battery chemistry detection method 600 then proceeds to decision step 614 to compare the open circuit voltage $V_{oc}$ to a first voltage threshold. According to one embodiment, the first voltage threshold is about 1.65 Volts. If the open circuit voltage $V_{oc}$ is greater than the voltage threshold (e.g., 1.65 Volts), method 600 determines that the battery cell is a lithium cell in step 616. Method 600 then ends at step 638.

If the open circuit voltage $V_{oc}$ is not greater than the first voltage threshold (e.g., 1.65 Volts), method 600 proceeds to decision step 620 to determine if the determined recovery time is less than a time period. According to one embodiment, the time period is 1 millisecond. If the recovery time is determined to be less than the time period (e.g., 1 millisecond), routine 600 proceeds to determine that the battery cell is a nickel metal hydride (NiMH) cell in step 622. Since any fresh lithium cell would have been detected in step 614, step 620 is able to detect a nickel metal hydride battery cell based on the recovery time. If the recovery time is not less than the time period (e.g., 1 millisecond), method 600 proceeds to decision step 626 to determine if the closed circuit voltage $V_{cc}$ is less than a second voltage threshold. According to one embodiment, the second voltage threshold is 0.9 Volts. If the closed circuit voltage $V_{cc}$ is less than the second voltage threshold (e.g., 0.9 Volts), method 600 determines that the battery cell is an alkaline battery cell in step 628. The method 600 then ends at step 638. Accordingly, a low closed circuit voltage below the second voltage threshold (e.g., 0.9 Volts) is used to determine that an alkaline battery cell is present.

If the closed circuit voltage is not less than the second voltage threshold (e.g., 0.9 Volts), method 600 proceeds to decision step 632 to determine if the open circuit voltage $V_{oc}$ is greater than a third voltage threshold. According to one embodiment, the third voltage threshold is 1.60 Volts. If the open circuit voltage is greater than the third voltage threshold (e.g., 1.60 Volts), method 600 proceeds to step 628 to determine that the cell is an alkaline battery cell. Accordingly, an open circuit voltage $V_{oc}$ greater than the third voltage threshold (e.g., 1.60 Volts) at the step 632 of method 600 is indicative of a fresh high capacity alkaline battery cell.

If the open circuit voltage $V_{oc}$ is not less than the second voltage threshold (e.g., 0.9 Volts) and not greater than the third voltage threshold (e.g., 1.60 Volts), method 600 proceeds to decision step 634 to determine if the internal resistance $R_{INTERNAL}$ count is less than a value. According to one embodiment, the value is 50. If the internal resistance value is less than the value (e.g., 50), method 600 determines that the battery cell is a nickel metal hydride battery cell in step 622. Accordingly, the internal resistance count may be employed to determine the presence of a nickel metal hydride battery cell.

If the internal resistance count is not less than the value (e.g., 50), method 600 proceeds to decision step 636 to determine if the open circuit voltage $V_{oc}$ is greater than a fourth voltage threshold. According to one embodiment, the fourth voltage threshold is 1.5 Volts. If the open circuit voltage $V_{oc}$ is greater than the fourth voltage threshold (e.g., 1.5 Volts), method 600 proceeds to step 616 to determine that the cell is a lithium battery cell and then supplies the first higher power to the light source in step 618. Otherwise, if the open circuit voltage $V_{oc}$ is not greater than the fourth voltage threshold (e.g., 1.5 Volts), method 600 proceeds to step 628 to determine the cell is an alkaline battery cell. Accordingly, step 636 is able to distinguish between a lithium battery cell and an alkaline battery cell based on the open circuit voltage $V_{oc}$.

While chemistry detection and control method 600 advantageously determines the chemistry composition of a battery cell based on internal resistance, recovery time, open circuit voltage and closed circuit voltage, it should be appreciated that the method 600 may look to one or more or any combination of these characteristics to determine the chemistry composition of the battery cell. It should further be appreciated that the method 600 may control any of a number of devices, including lighting devices, cameras, cell phones and other electrically powered devices based on the determined chemistry composition. Further, it should be appreciated that a stand alone battery chemistry detection device may be employed to determine the chemistry of the battery cell, which device may then be useful to provide an indication of the battery cell type and/or to control operation of an electronic device.

Additionally or alternatively, the energy storage system 24 and solar power energy storage system 27 can include the controller or microprocessor 82, which determines the electrochemical composition of the battery cells 78,80. Typically, the controller 82 implements substantially the same one or more software routines and/or receives similar data as the processor 36, as described above. Thus, the energy storage system 24 and solar power energy storage system 27 can determine the electrochemical composition of the power source that is internal to the system 24,27, and can control other operating characteristics of the system accordingly.

III. Fuel Gauging

With regards to FIGS. 1-5, 7-11, and 13-21, the lighting devices 14A,14B,14C can have a fuel gauging device 84, which indicates the state of charge of the power source 16,20, 22,24,26,27 that is currently providing electrical current to the light sources, such as the white flood LED 18A,the white spot LED 18B,and the red flood LED 18C. According to one embodiment, the fuel gauging device 84 works in conjunction with the electrochemical composition device, such as the determination made by the processor 36 of the lighting device 14A,14B,14C and/or the controller 82 of the energy storage systems 24,27, so that the fuel gauging device 84 first obtains the electrochemical composition of the power source 16,20, 22,24,26,27 determined by the processor 36,82 prior to determining the state of charge of the power source 16,20,22,24, 26,27. According to one embodiment, the fuel gauging device 84 determines and indicates the state of charge for the power sources 16,24,27 that the processor 36 determines the electrochemical composition. Additionally or alternatively, the fuel gauging device 84 includes a processor, according to one embodiment. According to an alternate embodiment, at least one of the fuel gauging device and the electrochemical composition device are not included in the lighting device 14A, 14B,14C, such that the fuel gauging device and electrochemical detection device are individual and separate devices, are used with a recharger device, a cellular phone, a personal digital assistant (PDA), a multimedia device, or the like.

With respect to FIG. 14, the fuel gauging device 84 determines the state of charge of the power source based upon the internal resistance of the power source and the closed circuit voltage ($V_{ccv}$). Thus, when the processor 36,82 obtains the internal resistance of the power source and the closed circuit voltage ($V_{ccv}$), the processor 36,82 can use lookup tables, as represented by the graph of FIG. 14, to determine the state of charge or the percent depth of discharge of the power source 16,24,27 due to the different characteristics of the exemplary electrochemical compositions of the power sources 16,24,27. The fuel gauging device 84 can then provide the state of charge, for example, as a data signal.

The fuel gauging device 84 also includes a state of charge indicator. In one example, the indicator is a graphical display that displays the remaining charge as a percentage. In another example, the indicator displays the remaining charge as an estimate of the remaining time the monitored power source 16,24,27 can continue to supply an adequate amount of power to illuminate the lighting sources 18A,18B,18C. According to one embodiment, the fuel gauging device 84 includes one or more fuel gauging LEDs 86. Thus, when multiple LEDs 86 are used, the LEDs 86 can be one or more colors to indicate the different states of charge of the power source 16,24,27. According to one embodiment, a green LED can be used to indicate that the power source 16,24,27 is at an adequate state of charge, and a red LED can be used to indicate that the power source 16,24,27 is at an inadequate state of charge. Alternatively, when a single LED 86 is used, a multi-color LED can be used in order to indicate the different states of charge of the power source 16,24,27. Further, each LED 86 can be in electrical communication with an LED driver. According to one embodiment, the green LED can be connected to a first fuel gauge LED driver generally indicated at 87A, and the red LED can be connected to a second fuel gauge LED driver generally indicated at 87B. However, it should be appreciated by those skilled in the art that any suitable number of LEDs and fuel gauging LED drivers can be used in the fuel gauging device 84.

Additionally or alternatively, the fuel gauging 84 does not illuminate the fuel gauging LED 86 when the lighting device 14A,14B,14C is being powered by one of the AC power source 20, the DC power source 22, or the solar power source 26, since such power sources 20,22,24 can provide a greater amount of electrical power than the internal power source 16, the energy storage system 24, and the solar energy storage system 27. Additionally, since the internal power source 16, the energy storage system 24, and the solar energy storage system 27 can include battery cells that have different electrochemical compositions, the electrochemical composition of the internal power source 16, the energy storage system 24, and the solar energy storage system 27 is determined, and the fuel gauging device 84 indicates the state of charge of the power source 16,24,27.

According to one embodiment, the fuel gauging device 84 does not continuously illuminate the fuel gauging LEDs 86, and thus, illuminates the fuel gauging LEDs 86 in predetermined time intervals. In such an embodiment, the fuel gauging device 84 can indicate the state of charge of the power source 16,24,27 at substantially the same predetermined time interval as the processor 36 determining the electrochemical composition of the power source 16,24,27. According to an alternate embodiment, the fuel gauging device 84 can illuminate the fuel gauging indicates, such as, but not limited to, LEDs 86 continuously. Alternatively, the fuel gauging device 84 can include a fuel gauging switch or button, which is depressed or actuated by a user to activate the fuel gauging device 84 and illuminate the fuel gauging LEDs 86. According to this embodiment, the processor 36,82 can determine the electrochemical composition of the power source 16,24, 27 when the fuel gauging button is depressed. According to one embodiment, the fuel gauging switch is one of the first, second, third, or fourth switches SW1,SW2,SW3, or SW4, which can be a multi-functional switch. According to an alternate embodiment, the fuel gauging switch is an additional switch on one or more of the devices 14A,14B,14C,26, 27 or the lighting system 20.

Figure 15:
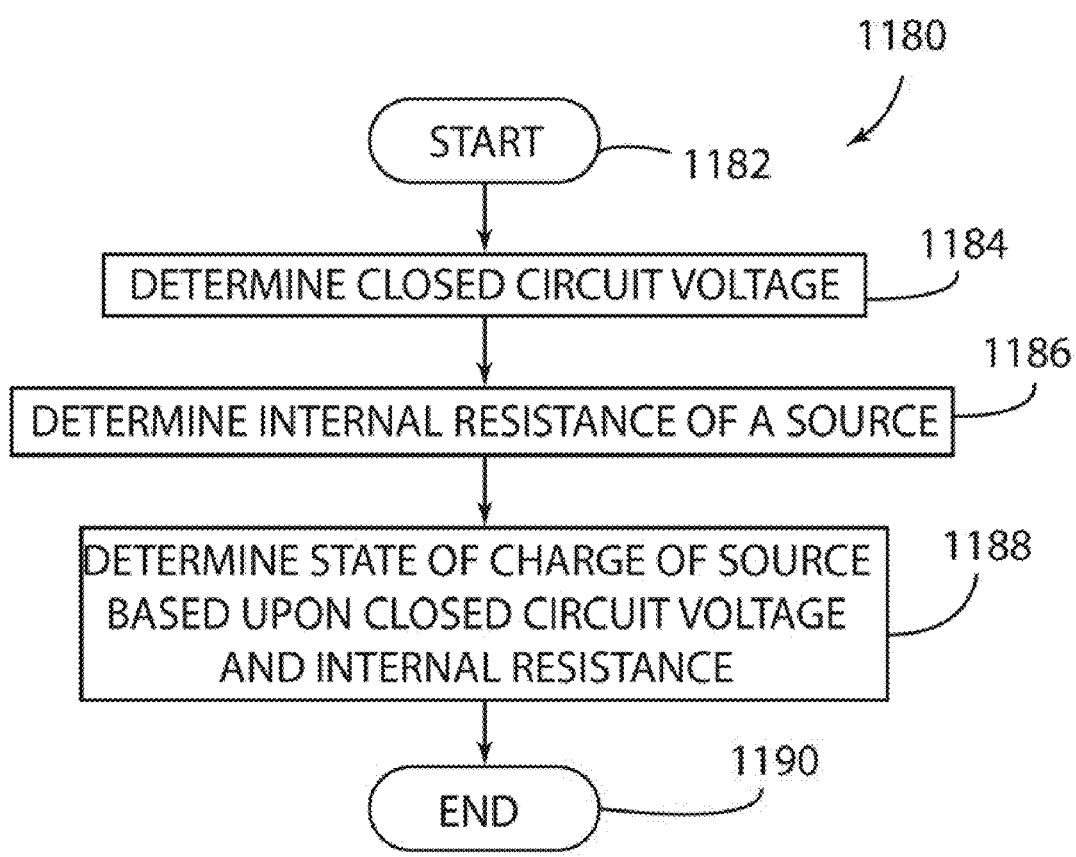
FIG. 15 is a flow chart illustrating a method of determining a state of charge of a power source of a device or system of a lighting system, in accordance with one embodiment of the present invention.

According to one embodiment, a method of determining a state of charge of a load or power source 16,24,27 is generally shown in FIG. 15 at reference identifier 1180. The method 1180 starts at step 1182, and proceeds to step 1184, wherein a closed circuit voltage ($V_{ccv}$) is determined. At step 1186, an internal resistance ($R_{Internal}$) of the power source 16,24,27 is determined. The method 1180 then proceeds to step 1188, wherein the state of charge of the power source 16,24,27 is determined based upon the closed circuit voltage ($V_{ccv}$) and the internal resistance ($R_{Internal}$). The method 1180 then ends at step 1190.

Figure 16:
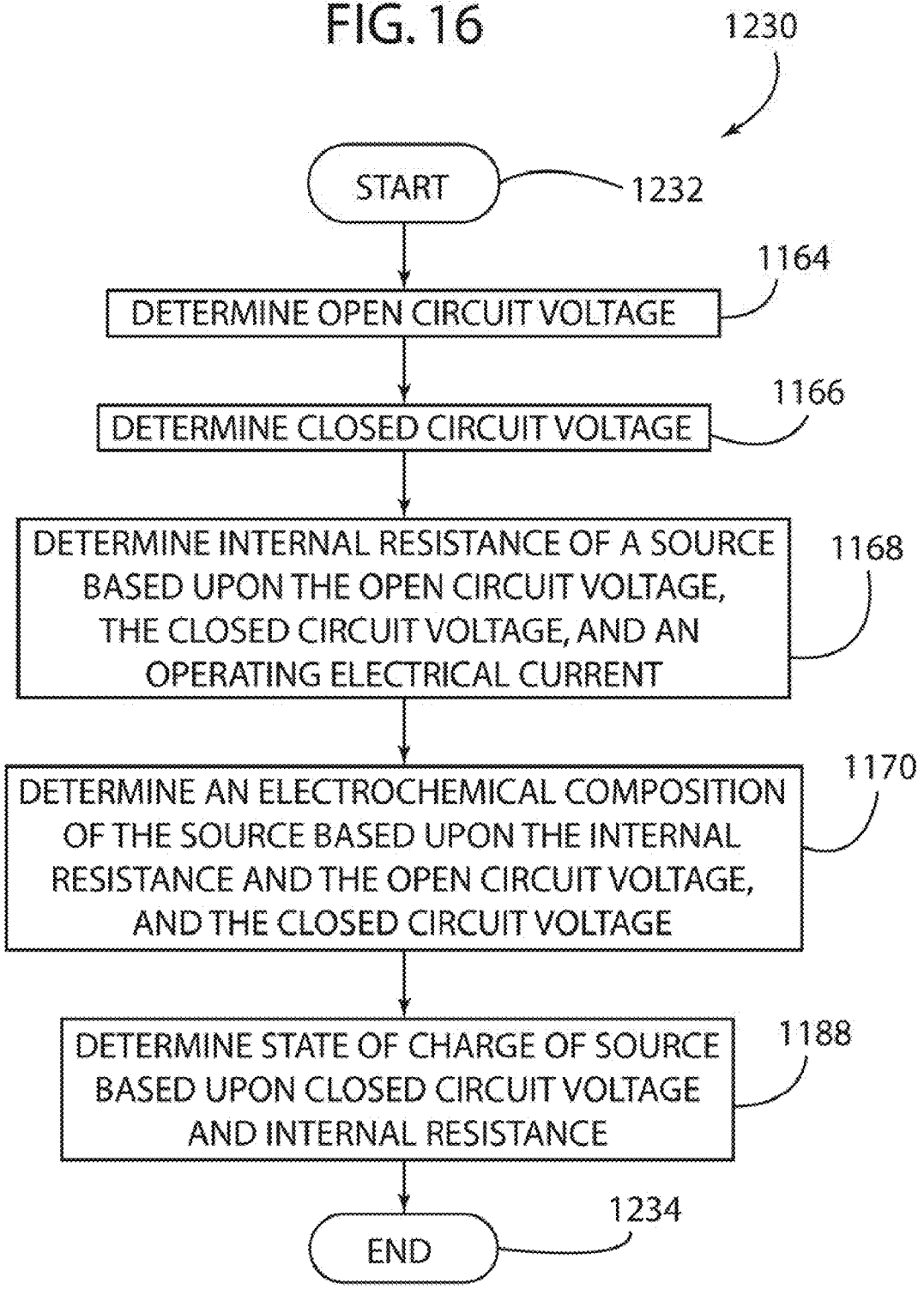
FIG. 16 is a flow chart illustrating a method of determining an electrochemical composition of a power source and a state of charge of the power source of a device or system of a lighting system, in accordance with one embodiment of the present invention.

According to one embodiment, a method of determining an electrochemical composition of a power source 16,24,27 and determining the state of charge of the power source 16,24,27 is generally shown in FIG. 16 at reference identifier 1230. The method 1230 starts at step 1232, and proceeds to step 1164, wherein an open circuit voltage ($V_{ocv}$) is determined. At step 1166, a closed circuit voltage ($V_{ccv}$) is determined. At step 1168, an internal resistance ($R_{Internal}$) of the power source 16,24,27 is determined based upon the open circuit voltage ($V_{ocv}$), the closed circuit voltage ($V_{ccv}$), and an operating electrical current. At step 1170, the electrochemical composition of the power source 16,24,27 is determined based upon the internal resistance ($R_{Internal}$), the open circuit voltage ($V_{ocv}$), and the closed circuit voltage ($V_{ocv}$). The method 1230 then proceeds to step 1188. At step 1188, the state of charge of the power source 16,24,27 is determined based upon the closed circuit voltage ($V_{ccv}$) and the internal resistance ($R_{Internal}$), and the method 1230 then ends at step 1234.

Additionally or alternatively, the lighting devices 14A,14B,14C can include a lockout function, which prevents the lighting sources 18A,18B,18C from being illuminated at undesirable times, such as a user mistakenly actuating one or more of the switches SW1,SW2,SW3, or SW4, to illuminate one or more of the lighting sources 18A,18B,18C.

According to one embodiment, the lockout function can be activated by pressing one or more of the switches SW1,SW2, SW3, or SW4 in a predetermined combination, for a defined period of time, the like, or a combination thereof. According to one embodiment, the fuel gauging LEDs 86 can be used to indicate when the lockout function is activated and deactivated. For purposes of explanation and not limitation, if the fuel gauging LED 86 is a tri-color LED that illuminates in green, yellow, and red, the fuel gauging LEDs 86 can be illuminated in a green-yellow-red sequence when the lockout function is activated. Also, the fuel gauging LEDs 86 can be illuminated in a red-yellow-green sequence when the lockout function is deactivated.

According to one embodiment, the fuel gauging LEDs 86 can also be used as an indicator for locating the lighting device 14A,14B,14C when the lighting device 14A,14B,14C is not in the user's physical possession. By way of explanation and not limitation, a user can activate an indication setting on the lighting device 14A,14B,14C, such as, but not limited to, when the internal battery source 16 is inserted into the housing 54. Thus, the user can select the indicator to be active when the lockout function is activated, the lockout function is deactivated, or a combination thereof. Typically, when the indicator function is activated, the fuel gauging LEDs 86 illuminate in predetermined intervals when the lighting sources 18A,18B,18C are not illuminated, and thus, a user can locate the lighting device 14A,14B,14C by seeing the fuel gauging LEDs 86 flashing in the predetermined intervals.

While the invention has been described in detail herein in accordance with certain preferred embodiments thereof, many modifications and changes therein may be affected by those skilled in the art without departing from the spirit of the invention. Accordingly, it is our intent to be limited only by the scope of the appending claims and not by way of the details and instrumentalities describing the embodiments shown herein.

What is claimed is:

1. A lighting device comprising:
    hardware circuitry adapted to electrically connect to a power source that has an electrochemical composition;
    a lighting source in electrical communication with said hardware circuitry;
    an electrochemical detection device configured to determine said electrochemical composition of said power source;
    a fuel gauging device configured to determine a state of charge of said power source based upon said determined electrochemical composition of said power source; and
    at least one switch configured to supply electrical power to said light source, wherein when said at least one switch is actuated, said fuel gauging device determines said state of charge of said power source.

2. The lighting device of claim 1, wherein said fuel gauging device determines said state of charge of said power source based upon a voltage potential of said power source and an internal resistance of said power source.

3. The lighting device of claim 1, wherein said fuel gauging device utilizes a look up table to determine said state of charge of said power source based upon a closed circuit voltage potential and an internal resistance of said power source.

4. The lighting device of claim 1, wherein said electrochemical composition detection device determines said electrochemical composition of said power source based upon of an open circuit voltage potential of said power source, a closed circuit voltage potential of said power source, and said internal resistance of said power source.

5. The lighting device of claim 1, wherein said fuel gauging device intermittently determines said state of charge of said power source at time intervals.

6. The lighting device of claim 1, wherein said electrochemical detection device determines said electrochemical composition of said power source as a function of recovery time of said power source.

7. The lighting device of claim 1, further comprising at least one fuel gauging indicator configured to indicate said determined state of charge.

* * * * *